(12) United States Patent
Gorbachov

(10) Patent No.: US 11,700,027 B2
(45) Date of Patent: Jul. 11, 2023

(54) MULTI-MODE WIFI BLUETOOTH RF FRONT-ENDS

(71) Applicant: Mobix Labs, Inc., Irvine, CA (US)

(72) Inventor: Oleksandr Gorbachov, Irvine, CA (US)

(73) Assignee: Mobix Labs, Inc., Irvine, CA (US)

( * ) Notice: Subject to any disclaimer, the term of this patent is extended or adjusted under 35 U.S.C. 154(b) by 0 days.

(21) Appl. No.: 17/236,428

(22) Filed: Apr. 21, 2021

(65) Prior Publication Data

US 2021/0351810 A1     Nov. 11, 2021

Related U.S. Application Data

(60) Provisional application No. 63/020,117, filed on May 5, 2020.

(51) Int. Cl.
    *H04B 1/401*        (2015.01)
    *H04B 1/04*         (2006.01)
    *H03F 3/24*          (2006.01)

(52) U.S. Cl.
CPC .............. *H04B 1/401* (2013.01); *H03F 3/24* (2013.01); *H04B 1/04* (2013.01); *H03F 2200/171* (2013.01); *H03F 2200/294* (2013.01); *H03F 2200/451* (2013.01); *H04B 2001/045* (2013.01)

(58) Field of Classification Search
CPC ......... H03F 2200/171; H03F 2200/294; H03F 2200/451; H03F 3/24; H04B 1/04; H04B 1/401; H04B 2001/045
See application file for complete search history.

(56) References Cited

U.S. PATENT DOCUMENTS

| | | | |
|---|---|---|---|
| 6,108,313 A | 8/2000 | Lee et al. | |
| 6,356,536 B1 | 3/2002 | Repke | |
| 6,560,443 B1 * | 5/2003 | Vaisanen | ................ H01Q 21/28 455/73 |
| 6,937,845 B2 | 8/2005 | Watanabe et al. | |
| 6,977,552 B2 | 12/2005 | Macedo | |
| 6,982,672 B2 | 1/2006 | Lin et al. | |

(Continued)

FOREIGN PATENT DOCUMENTS

WO     2008002697 A2     1/2008

OTHER PUBLICATIONS

PCT International Search Report and written opinion for PCT/US2012/036187; dated Sep. 24, 2012; 14 pages.

(Continued)

*Primary Examiner* — Nguyen T Vo
(74) *Attorney, Agent, or Firm* — Stetina Brunda Garred & Brucker

(57) ABSTRACT

A radio frequency front end circuit for a multimode transceiver has a first operating mode transmit input port, a second operating mode transmit input/receive output port, and a hybrid first and second operating mode receive output port. A first switch network has one or more switch elements together selectively connecting the first operating mode transmit input port, the second operating mode transmit input/receive output port, and the hybrid first and second operating mode receive output port to a coexistence filter first port. A second switch network has one or more switch elements that together selectively connect a coexistence filter second port to an antenna port.

11 Claims, 16 Drawing Sheets

(56) References Cited

U.S. PATENT DOCUMENTS

| | | | |
|---|---|---|---|
| 7,315,730 | B2 | 1/2008 | Galan |
| 7,656,251 | B1 | 2/2010 | Bauder et al. |
| 7,903,724 | B2 | 3/2011 | Rofougaran |
| 8,005,504 | B2 | 8/2011 | Sano et al. |
| 8,036,148 | B2 | 10/2011 | Fukamachi et al. |
| 9,093,967 | B2 | 7/2015 | Gorbachov |
| 2002/0090974 | A1* | 7/2002 | Hagn ............... H04B 1/48 455/552.1 |
| 2004/0209584 | A1 | 10/2004 | Bargroff et al. |
| 2004/0251966 | A1 | 12/2004 | Yeh |
| 2006/0045202 | A1 | 3/2006 | Rafi et al. |
| 2006/0068730 | A1 | 3/2006 | Khorram |
| 2007/0188224 | A1 | 8/2007 | Dow et al. |
| 2007/0222697 | A1 | 9/2007 | Caimi et al. |
| 2007/0232241 | A1 | 10/2007 | Carley et al. |
| 2007/0232358 | A1 | 10/2007 | Sherman |
| 2008/0079499 | A1 | 4/2008 | Tsai |
| 2008/0089252 | A1 | 4/2008 | Choi |
| 2008/0159458 | A1 | 7/2008 | Cheng et al. |
| 2008/0233890 | A1 | 9/2008 | Baker |
| 2008/0246547 | A1 | 10/2008 | Blednov |
| 2008/0279262 | A1 | 11/2008 | Shanjani |
| 2008/0299987 | A1 | 12/2008 | Iyer et al. |
| 2009/0036065 | A1 | 2/2009 | Siu |
| 2009/0167627 | A1 | 7/2009 | Breiter |
| 2009/0179702 | A1 | 7/2009 | Blednov |
| 2009/0207764 | A1 | 8/2009 | Fukamachi et al. |
| 2010/0291888 | A1 | 11/2010 | Hadjichristos et al. |
| 2010/0327976 | A1 | 12/2010 | Klemens et al. |
| 2011/0003563 | A1 | 1/2011 | Gorbachov |
| 2011/0096705 | A1 | 4/2011 | Kemmochi et al. |
| 2012/0280754 | A1* | 11/2012 | Gorbachov ............ H03F 3/68 330/302 |
| 2014/0227984 | A1* | 8/2014 | Tran ............... H04B 1/406 455/78 |
| 2015/0245372 | A1 | 8/2015 | Desai et al. |

OTHER PUBLICATIONS

PCT International Search Report and written opinion for PCT/US2021/30497; dated Aug. 3, 2021; 15 pages.
Gorbachov, Oleksandr; "CMOS WiFi RF Front-Ends for Mobile Handset Applications. Part-1: Preserving WCDMA Receiver Sensitivity" Mar. 2012, 15 pages.
Atmel: Bluetooth Front-end IC T7024 Design Guide; Jun. 2004; 18 pages.
Atmel: Integrated SiGe Front-end RF ICs;2003, 2 pages.
Atmel: 5-GHz WLAN Power Amplifier for 802.11a, ATR3515 Preliminary; 2004, 7 pages.
Atmel: High Gain Power Amplifier for 802.11 b/g WLAN Systems, ATR7032 Preliminary; 2006, 15 pages.
Atmel: ZigBee IEEE 802.15.4 Radio Transceiver; AT86RF230, Preliminary; 2007, 82 pages.
Anadigics: AWM6430; 3.5 GHz WiMAX Power Amplifier Module, Advanced Product Information—Rev. 0.1; Jan. 2005; 12 pages.
Broadcom; BCM4328 Product Brief; Air Force One Single-Chip IEEE 802.11a/b/g MAC/Baseband/Radio With Integrated CPU; Dec. 5, 2006; 2 pages.
Broadcom; BCM4326 Product Brief; Air Force One Single-Chip IEEE 802.11b/g MAC/Baseband/Radio With Integrated CPU; Dec. 5, 2006; 2 pages.
Broadcom: BCM94318 Product Brief: Airforce One Chip 802.11 Reference Design; Oct. 7, 2004; 2 pages.
Xin He, Fully Integrated Transceiver Design in SOI Processes, a Dissertation, Kansas State University, 2004, 129 pages.
Maxim: Industry's First Ultra-Low-Power, 802.11g/b RF Transceiver to Integrate PA, Rx/Tx/Antenna Diversity Switches, and Crystal Oscillator Circuitry; Apr. 30, 2008; 2 pages.
Maxim: MAX2830 Industry's First802.11G/B RF Transceiver with Integrated PA, Rx/Tx and Antenna Switches; Jan. 30, 2008; 3 pages.

Meshnetics: ZigBit Amp OEM Modules; ZDM-A1281-PN/PNO (MNZG-A24-UFL/UO) Revision 2.2; Ultra-Compact 2.4GHz 802.15.4/ZigBee Modules with Power Amplifier for Wireless Networking Applications; Oct. 2008, 18 pages.
Meshnetics M2M-100-2008: ZigBit Amp Module; 2.4 GHz Amplified Modules for IEEE 802.15.4/ZigBee Wireless Mesh Networking Applications; 2008; 2 pages.
Meshnetics: ZigBit Amp OEM Modules ZDM-A1281-PN/PNO Revision 2.1; Ultra-Compact 2.4GHz 802.15.4/ZigBee Modules with Power Amplifier for Wireless Networking Applications; Dec. 2007, 15 pages.
Murata MF2400PJ-SF0702; PA MMIC for 2.4GHz Wireless Communication; Jan. 18, 2003; 11 pages.
CEL; GaAs Integrated Circuit PG2250T5N; 1.8 V, Power Amplifier for Bluetooth Class 1; NEC Electronics Corp.; 2006, 12 pages.
CEL NEC's Power Amplifier for Bluetooth Class 1: UPG2301TQ Data Sheet; Feb. 4, 2004; 7 pages.
CEL: GaAs HBT Integrated Circuit PG2314T5N: Power Amplifier for Bluetooth Class 1; Jul. 2006, 10 pages.
CEL Application Note: AN1048 UPG2150T5L Switch; Sep. 29, 2005, 1 page.
CEL California Eastern Laboratories: AN1049 UPG2314T5N HBT PA IC for Bluetooth and ZigBee; Oct. 17, 2006; 5 pages.
RT2501 Wireless Chipset 802.11 b/g solution featuring Packet—Overdrive Technology; Ralink Technology Corp; 2006, 1 page.
RT2501U; USB2.0 Wireless Chipset 802.11 b/g solution featuring Packet-Overdirve Technology; Ralink Technology Corp., 2006, 1 page.
RT2600 MIMO XR Wirless Chipset 802.11b/g solution featuring Packet-Overdirve and Range-Overdirve Technologies; Ralink Technology Corp; 2006, 1 page.
RT2700 MIMO Wireless Chipset Family; 802.11n Solution featuring MIMObility Technology; Ralink Technology Corp; 2006, 2 pages.
RT2800 MIMO Wireless Chipset Family 802.11n Solution featuring MIMObility Technology; Ralink Technology Corp; 2006, 2 pages.
RT5201 Wireless Chipset 802.11 a/b/g solution featuring Packet-Overdirve Technology; Ralink Technology Corp; 2006, 1 page.
RT5201U USB 2.0 Wireless Chipset 802.11 a/b/g solution featuring Packet-Overdirve Technology; Ralink Technology Corp; 2006, 1 page.
RT5600 MIMO XR Wireless Chipset 802.11 a/b/g solution featuring Packet-Overdirve and Range-Overdirve Technologies; Ralink Technology Corp; 2006, 1 page.
Agnelli, Federico, et al.; Wireless Multi-Standard Terminals: System Analysis and Design of a Reconfigurable RF Front-end; IEEE Circuits and Systems Magazine; First Quarter 2006; p. 38-59.
Cutler, Tim; ZigBee: RF power options in ZigBee solutions; Emerging Wireless Technology/A Supplement to RF Design; www.rfdesign.com; Mar. 2006; p. 18-21.
Richwave RTC6682 VO.3 Data Sheet; www.richwave.com.tw; Aug. 2006; 7 pages.
WLAN WiMAX PA & FEM Market, Feb. 12, 2009; 158 page presentation.
Cirronet ZigBee High Power Module ZMN2405HP; Oct. 28, 2007; 6 pages.
Cirronet ZigBee High Power Module ZMN2430HP; Oct. 28, 2007; 6 pages.
Design of a Dual Band Wireless LAN SiGe-Bipolar Power Amplifier; from Sep. 2004 High Frequency Electronics 8 pages.
EPCOS WLAN Modules Preliminary Datasheet R041_M01; Jun. 20, 2006; 14 pages.
Ember Datasheet; EM2420 2.4 GHz IEEE 802.15.4 / ZigBee RF Transceiver; Copyright 2003, 2004 by Ember Corporation; 89 pages.
Free2Move Class 1 Bluetooth Module—F2M03C1 Datasheet; Rev. Sep. 13, 2005; 46 pages.
Freescale Semiconductor Technical Data Document No. MC13191/D; Rev. 1.2 Apr. 2005; MC13191: 2.4 GHz ISM Band Low Power Transceiver; 24 pages.
Freescale Semiconductor Technical Data Document No. MC13192; Rev. 3.2 May 2007; MC13192: 2.4 GHz Low Power Transceiver for the IEEE 802.15.4 Standard; 24 pages.

(56) References Cited

OTHER PUBLICATIONS

Freescale Semiconductor; MC13191: 2.4 GHz Low Power Transceiver for the IEEE 802.15.4 Standard; Reference Manual; Document No. MC13191RM; Rev. 1.2; Apr. 2005; 92 pages.
Freescale Semiconductor Technical Data; Document No. MC13192; Rev. 2.8, Apr. 2005; MC13192/MC13193: 2.4 GHz Low Power Transceiver for the IEEE 802.15.4 Standard; 23 pages.
Freescale Semiconductor MC13192/MC13193: 2.4 GHz Low Power Transceiver for the IEEE 802.15.4 Standard; Reference Manual; Rev. 1.3 Apr. 2005; 111 pages.
California Eastern Laboratories; ZIC2410 Datasheet; Rev. A; Document No. 0005-05-07-00-000; Jun. 20, 2008; 119 pages.
CEL Preliminary Data Sheet; Apex & Apex LT Series Transceiver Modules; ZAXM-201-1, ZALM-301-1; May 7, 2008; 17 pages.
CEL Preliminary Data Sheet; Freestar Series Transceiver Module; ZFSM-101-1; May 7, 2008; 10 pages.
CEL Preliminary Data Sheet; Matrix Transceiver Modules; ZMXM-400 Series; May 7, 2008; 12.
J. Trachewsky, et al.; Broadcom WLAN Chipset for 802.11a/b/g; Broadcom Corporation, CA, USA; Aug. 17, 2003; 42 pages.
Anadigics; AWL6254; 1.4 GHz 802.11b/g/n; WLAN PA, LNA, and RF Switch Data Sheet—Rev 2.0; Feb. 2008; 16 pages.
Anadigics; AWM6430; 3.3-3.6 GHz Power Amplifier Module; Preliminary Data Sheet; Rev 1.0; Jan. 2006; 12 pages.
Zhang, Weimin; A Low Voltage Fully-Integrated 0.18um CMOS Power Amplifier for 5GHz WLAN; Institute of Microelectronics, Singapore; 2002; 4 pages.
Copeland, Miles A.; 5-GHz SiGe HBT Monolithic Radio Transceiver with Tunable Filtering; IEEE Transactions on Microwave Theory and Techniques, vol. 48 No. 2, 12 pages, Feb. 2000.
Atheros: AR3011—ROCm Solutions for Bluetooth; Radio-On-Chip for Mobile (ROCm) Products; Jan. 22, 2008; 2 pages.
Atheros: AR3000—ROCm Solutions for Bluetooth Radio-On-Chip for Mobile (ROCm) Products; Jan. 22, 2008 AR3031; 2 pages.
Atheros: ROCm Platform; Radio-On-Chip for Mobile {ROCm; AR6001GL; Embedded 802.11b/g Solution for Mobile and Battery-Operated Devices; 2006; 2 pages.
Atheros; AR6002 Breaking the Power Barrier in Mobile WiFi; Aug. 28, 2008; 2 pages.
Atheros:AR6001GL; Embedded 802.11b/g Solution for Mobile and Battery-Operated Devices; 2006; 2 pages.
California Eastern Laboratories Fully-Integrated RF Transceiver System-on-Chip ForZigBee/IEEE 302.15.4 Applications Announced; California Eastern Laboratories, Aug. 6, 2008; 2 pages.
Atheros; AR6101G; World's Most Integrated, Cost-Effective Single-Chip WLAN Handset Design Brings Voice-Over-WiFi to the Mainstream; 2006; 2 pages.
Atheros; AR9285 Single-chip PCIe based on 802.11n 1-stream specification; Oct. 28, 2008; 2 pages.
Atheros; AR9002AP-1S; AP/Router solution based on 802.11n 1-stream specification; Oct. 28, 2008; 2 pages.
An Introduction to Orthogonal Frequency Division Multiplex Technology; Keithley, 17 pages, 2007.
SiGe PA Enables Smallest System Footprint For Embedded WLAN; Semiconductor Online; Dec. 15, 2008; 3 pages.
Skyworks: SKY65336: 2.4 GHz Transmit/Receive Front-End Module with Integrated LNA; Skyworks Solutions, Inc.; Aug. 20, 2008; 2 pages.
Skyworks; SKY65337: 2.4 GHz Transmit/Receive Front-End Module; Skyworks Solutions, Inc.; Aug. 20, 2008; 2 pages.
Skyworks; SKY65241-12: WLAN 802.11a, b, g, n Dual-Band Intera Front-End Module Single Antenna; Skyworks Solutions, Inc.; Mar. 12, 2008; 9 pages.
Skyworks; SKY65243-11: WLAN 802.11a, b, g, n Dual-Band Intera Front-End Module Dual Antennas; Skyworks Solutions, Inc.; Mar. 12, 2008; 8 pages.
Skyworks; SKY65256-11: WLAN 802.11a, b, g, n Dual-Band Front-End Module Single Antenna; Skyworks Solutions, Inc.; Sep. 28, 2007; 10 pages.
Skyworks; SKY65228-11: WLAN 802.11n Single Band 4.9-5.85 GHz MIMO Intera Front-End Module; Skyworks Solutions, Inc.; Oct. 9, 2007; 9 pages.
Skyworks; SKY65206-13: WLAN 802.11b/g Intera Front-End Module; Skyworks Solutions, Inc.; Aug. 21, 2007; 7 pages.
Skyworks; SKY65249-11: WLAN 802.11b, g, n Intera Front-End Module; Skyworks Solutions, Inc.; Nov. 30, 2007; 9 pages.
Skyworks; SKY65227-11: WLAN 802.11n Single Band Intera 2.4 GHz MIMO Intera Front-End Module; Skyworks Solutions, Inc.; Oct. 9, 2007; 9 pages.
Skyworks; SKY65230-11: WLAN 802.11 n 2×2 MIMO Intera Front-End Module with 3 Antenna Ports; Skyworks Solutions, Inc.; Oct. 9, 2007; 13 pages.
Skyworks; SKY65225-11: WLAN 802.11n 2×2 MIMO Intera Front-End Module; Skyworks Solutions, Inc.; May 7, 2007; 11 pages.
Skyworks; SKY65135: WLAN Power Amplifier; Skyworks Solutions, Inc.; Mar. 26, 2007; 13 pages.
Skyworks; SKY65209: WLAN 802.11 b/g Front-End Module ; Skyworks Solutions, Inc.; Jan. 18, 2006; 8 pages.
4.9-5.8 GHz High-Linearity Power Amplifier SST11LP11; SST Communications Corp; 2005, 14 pages.
4.9-5.8 GHz High-Linearity Power Amplifier SST11LP12; SST Communications Corp; 2005, 14 pages.
2.4 GHz Power Amplifier SST12LP00; SST Communications Corp; 2005, 9 pages.
2.4 GHz High-Linearity Power Amplifier SST12LP10; SST Communications Corp; 2005, 12 pages.
2.4 GHz Power Amplifier SST12LP14; SST Communications Corp; 2005, 12 pages.
2.4 GHz High-Power, High-Gain Amplifier SST12LP15; SST Communications Corp; 2005, 12 pages.
2.4 GHz High-Power, High-Gain Amplifier SST12LP15A; SST Communications Corp; 2005, 12 pages.
STLC2500C: Bluetooth EDR Single Chip Data Brief; STMicroelectronics; Jan. 2006, 4 pages.
STLC4550: Single Chip 802.11b/g WLAN radio Data Brief; STMicroelectronics; Feb. 2006, 5 pages.
ZigBee—compliant wireless control and sensoring network solutions; STMicroelectronics; Jun. 2006; 8 pages.
Amin, Yasar, et al.; Integration of Passives for Receiver Front-End for 5GHz Wireless LAN Applications; Royal Institute of Technology, Sweden & U of Engineering & Tech, Taxila, Pakistan; 2004; p. 24-29.
Texas Instruments: CC2591; 2.4-GHz RF Front End, data sheet, Jun. 2008, Texas Instruments, Inc. 18 pages.
Texas Instruments: CC2436; High-Power Dual-Band (2.4-GHz and 4.9-GHz to 5.9-GHz) RF Front End, data sheet, May 2007; Texas Instruments, Inc. 15 pages.
Hoppenstein, Russell; High-Performance WiMAX RF Chipset Enable CPE and BTS Applications; Texas Instruments Inc.; Oct. 20, 2006.
Texas Instruments: Technology for Innovators: WiLink 4.0 single-chip mobile WLAN solutons Product Bulletin; 2006 Texas Instruments Inc., 2 pages.
Chipcon Products from Texas Instruments: CC2420; 2.4 GHz IEEE 802.15.4 / ZigBee-ready RF Transceiver; 2008, Texas Instruments Inc., 89 pages.
Chipcon Products from Texas Instruments: CC2430; A True System-on-Chip solution for 2.4 GHz IEEE 802.15.4/ ZigBee; 2007, Texas Instruments Inc., 212 pages.
Texas Instruments: CC2520 Datasheet; 2.4 GHz IEEE 802.15.4/ Sizabee RF Transceiver; Dec. 2007; Texas Instruments Inc.; 2007; 128 pages.
Zheng, Shaoyong, et al.; Distributed Power Amplifier/Feedback Low Noise Amplifier Switch-Less Front-End; Dept. Electronic Engineering, City University of Hong Kong, Feb. 8, 2006, p. 1659-1662.
Masse, Cecile; Analog/RF Front End; A direct-conversion transmitter for WiMAX and WiBro applications; www.rfdesign com ; Jan. 2006, 3 pages.
XBee OEM RF Modules; ZigBee / 802.15.4 OEM RF Modules by MaxStream, Inc. Specifications; MaxStream, Inc., 2005, 2 pages.
Fanucci, L, et al.; A Novel Fully Integrated Antenna Switch for Wireless Systems; Pisa, Italy, Sep. 16, 2003; 4 pages.

(56) References Cited

OTHER PUBLICATIONS

RFMD: Mobile Computing: Front End Module Portfolio; rfmd.com; 2009, 2 pages.
Maxim: Application Note 686; QPSK Modulation Demystified; May 1, 2002; 7 pages.

* cited by examiner

MULTI-MODE WIFI BLUETOOTH RF FRONT-ENDS

CROSS-REFERENCE TO RELATED APPLICATIONS

This application relates to and claims the benefit of U.S. Provisional Application No. 63/020,117 filed May 5, 2020 and entitled "MULTI-MODE WIFI BLUETOOTH RF FRONT-ENDS" the disclosure of which is wholly incorporated by reference in its entirety herein.

STATEMENT RE: FEDERALLY SPONSORED RESEARCH/DEVELOPMENT

Not Applicable

BACKGROUND

1. Technical Field

The present disclosure relates generally to radio frequency (RF) integrated circuits, and more particularly, to multi-mode WiFi and Bluetooth RF front ends.

2. Related Art

Wireless communications systems find applications in numerous contexts involving information transfer over long and short distances alike, and a wide range of modalities tailored for each need have been developed. Chief among these systems with respect to popularity and deployment is the mobile or cellular phone. Generally, wireless communications utilize a radio frequency carrier signal that is modulated to represent data, and the modulation, transmission, receipt, and demodulation of the signal conform to a set of standards for coordination of the same. Many different mobile communication technologies or air interfaces exist, including GSM (Global System for Mobile Communications), EDGE (Enhanced Data rates for GSM Evolution), and UMTS (Universal Mobile Telecommunications System). Various generations of these technologies exist and are deployed in phases. The latest is the 5G broadband cellular network system, though many of the currently deployed networks are still 4G/LTE (GSM Long Term Evolution). Besides mobile communications modalities such as the foregoing, mobile phones also incorporate local area data networking modalities such as WiFi (IEEE 802.11 family of standards), Bluetooth, and so on.

A fundamental component of mobile handsets, or any wireless communications system for that matter, is the transceiver—the combined transmitter and receiver circuitry. The transceiver encodes the data to a baseband signal and modules it with an RF carrier signal. Upon receipt, the transceiver down-converts the RF signal, demodulates the baseband signal, and decodes the data represented by the baseband signal. An antenna connected to the transmitter converts the electrical signals to electromagnetic waves, and an antenna connected to the receiver converts the electromagnetic waves back to electrical signals. Conventional mobile handset transceivers typically do not generate sufficient power or have sufficient sensitivity for reliable communications standing alone. Thus, additional conditioning of the RF signal is necessary. The circuitry between the transceiver and the antenna that provide this functionality is referred to as the front-end, which includes a power amplifier for increased transmission power, and/or a low noise amplifier for increased reception sensitivity.

A functionality frequently demanded of the mobile phone networks by its users is multitasking, particularly the simultaneous use of the mobile communications or cellular network modality during voice calls, and the data communications or WiFi modality to browse the Internet and/or download data. There are several challenges associated with such operation, one of which is the crowded RF environment within which the WiFi subsystem operates. Furthermore, some mobile communications subsystems such as LTE utilize a frequency domain duplex protocol in which the transmitter and the receiver are always activated. The transmissions from the WiFi subsystem, notwithstanding different operating frequencies, tend to cause spurious noise and interference. Additionally, Global Positioning System (GPS) signal reception may be impacted even though the operating frequencies are different than those of WiFi signals.

The diminutive size of the handset and the attendant necessity for locating the respective antennas of the different communications subsystems in relatively close proximity to each other add another layer of challenges. Within these restrictions, one of the important objectives is to prevent the baseband and other types of noise from the WiFi communications subsystem from interfering with reliable cellular network reception, without overloading or de-sensitizing the mobile communications subsystem.

Consequently, filtering is critical in the implementation of multimode mobile communications handsets. In the combined LTE and WiFi operating environment, band-pass co-existence filters are used to minimize the degradation of sensitivity in the LTE receive chain as well as the GPS receive chain. Additional rejection of unwanted spectrum emissions such as harmonics of WiFi transmissions may be possible with such filters. However, these are typically low temperature co-fired ceramic (LTCC) devices that tend to be bulkier and thereby increase the overall footprint of the printed circuit board. Furthermore, such co-existence filters also degrade the performance of the WiFi system due to increased current consumption and degraded reception sensitivity.

Some filtering can be incorporated into the power amplifier chain in order to minimize the demand for external filtering. The filter is typically connected at the input of the power amplifier, and though it would be advantageous to fabricate the filter on-die, the performance of such implementations has been inadequate. Problematically, the fairly low Q-factors of on-die components necessitated the addition of an external co-existence filter. Other approaches have attempted to reduce filter-associated losses and current consumption by placing the filter on the antenna side. Another approach involved the placement of a co-existence filter in front of the final power amplifier stage. This approach may not be applicable with certain semiconductor technologies because of the potential modulation noise within frequencies of interest, particularly when the filter is tuned for frequency ranges nearby those of the WiFi operating frequencies. Furthermore, the typical insertion loss of a co-existence filter in the WiFi power amplifier chain is approximately 1.5 dB to 3.0 dB, thus requiring such power amplifier to have a higher output level that in turn draws higher current from the power source (battery). The insertion loss associated with the external co-existence filter also decreases the receive sensitivity of the WiFi chain, adversely affecting the link distance and data throughput. Similar issues are understood to be present in transceiver systems with concurrent WiFi transmission and GPS reception operations.

Accordingly, there is a need in the art for an improved multi-mode RF front end that solves the aforementioned co-existence issues of WiFi and/or Bluetooth transmit signals overlapping with the reception range of LTE and GPS. Furthermore, there is a need in the art for dual band, WiFi/Bluetooth front ends without antenna-side coexistence filters so that DC power consumption can be reduced.

BRIEF SUMMARY

The present disclosure contemplates a multi-mode WiFi and Bluetooth radio frequency (RF) front end that may be implemented on a single die. The front end may resolve coexistence issues with cellular/LTE and GPS simultaneously operating. The embodiments of the front end may be utilized in portable wireless platforms, as DC current consumption can be significantly reduced.

In one embodiment, there may be a radio frequency front end circuit for a multimode transceiver. The front end may include a first operating mode transmit input port, a second operating mode transmit input/receive output port, and a hybrid first and second operating mode receive output port. Additionally, there may be a coexistence filter first port and a coexistence filter second port, along with an antenna port. There may be a first switch network that includes one or more switch elements. These switch elements may together selectively connect the first operating mode transmit input port, the second operating mode transmit input/receive output port, and the hybrid first and second operating mode receive output port to the coexistence filter first port. The front end circuit may also include a second switch network that has one or more switch elements that together selectively connect the coexistence filter second port to the antenna port.

Another embodiment of the present disclosure contemplates a radio frequency front end circuit for a multimode transceiver. This front end circuit may include a first operating mode, first frequency band transmit input port, a first operating mode, second frequency band transmit input port, a first operating mode, second frequency band receive output port, a second operating mode transmit input/receive output port, and a hybrid first operating mode, first frequency band and second operating mode receive output port. There may also be a first frequency band external device first port, a first frequency band external device second port, a second frequency band external device first port, and a second frequency band external device second port. The front end circuit may further include a first frequency band antenna port and a second frequency band antenna port. There may be a first switch network that has one or more switch elements. These switch elements may together selectively connect the first operating mode, first frequency band transmit input port, the second operating mode transmit input/receive output port, and the hybrid first operating mode, first frequency band and second operating mode receive output port to the first frequency band external device first port. There may also be a second switch network with one or more switch elements. These switch elements, in turn, may together selectively connect the first frequency band external device second port to the first frequency band antenna port. The front end circuit may include a third switch network with one or more switch elements that together selectively connect the first operating mode, second frequency band transmit input port and the first operating mode, second frequency band receive output port to the second frequency band external device first port. Furthermore, the front end circuit may include a fourth switch network with one or more switch elements. These switch elements may together selectively connect the second frequency band external device second port to the second frequency band antenna port.

Still another embodiment may be a radio frequency front end connectible to a multimode transceiver with one or more transmit lines and one or more receive lines. The front end may also be connectible to an antenna. The front end may include a driver power amplifier with an input connectible to one of the transmit lines. Additionally, the front end may include a coexistence filter that is selectively connected to the output of the driver power amplifier, to other ones of the transmit lines, and to the one or more receive lines. There may also be a final power amplifier that is forwardly and reversely connectible to the coexistence filter and to the antenna.

The present disclosure will be best understood accompanying by reference to the following detailed description when read in conjunction with the drawings.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

A multi-mode WiFi and Bluetooth radio frequency (RF) front end circuit implemented on a single semiconductor die in accordance with the present disclosure may coexist while the Long Term Evolution (LTE) cellular subsystem as well as Global Positioning System (GPS) signal reception remains operational without overloading or desensitizing the same. The various embodiments contemplate the elimination of the antenna-side co-existence filter, which is envisioned to improve the performance of the LTE, GPS, and WiFi systems.

The detailed description set forth below in connection with the appended drawings is intended as a description of the several presently contemplated embodiments of the RF integrated circuit and is not intended to represent the only form in which the disclosed invention may be developed or utilized. The description sets forth the functions and features in connection with the illustrated embodiments. It is to be understood, however, that the same or equivalent functions may be accomplished by different embodiments that are also intended to be encompassed within the scope of the present disclosure. It is further understood that the use of relational terms such as first and second and the like are used solely to distinguish one from another entity without necessarily requiring or implying any actual such relationship or order between such entities.

The described examples are particular to a multimode communications system that includes an LTE (Long Term Evolution, Wideband Code Division Multiple Access [WCDMA]-High Speed Packet Access [HSPA]), as well as a WiFi data networking modality. As referenced herein, the terms LTE and WiFi are understood to be specific examples of general components of the system. In this regard, the features of the present disclosure are understood to be applicable to other communications and networking modalities, such as GSM (Global System for Mobile Communications), GPRS (General Packet Radio Service, EDGE (Enhanced Data rates for GSM Evolution), and WCDMA, CDMA2000, and so forth. Those having ordinary skill in the art will be able to implement corresponding systems for such alternative communications modalities and particular operating frequencies attendant thereto based upon the disclosures herein. As such, reference to a specific communications modality in relation to particular components is by way of example only and not of limitation. Broader descriptors will also be referenced to the extent possible, but may be omitted for the sake of simplification.

Figure 1:
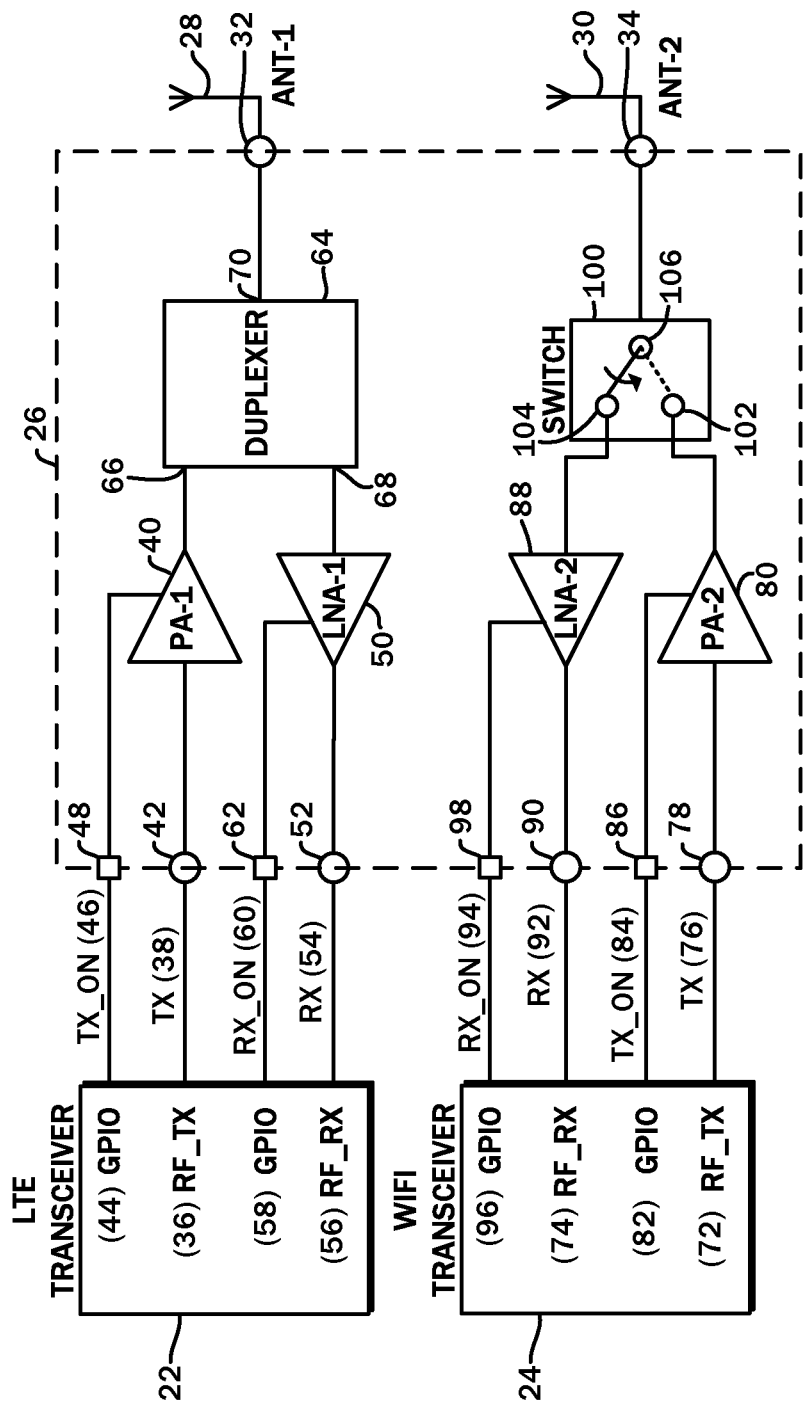
FIG. 1 is a block diagram illustrating one embodiment of a multimode communications system including a first transceiver, a second transceiver, a front end circuit, and a pair of antennas.

Referring now to the block diagram of FIG. 1, there is shown a multimode communications system 20 that includes a first transceiver 22 for the LTE modality/standard, and a second transceiver 24 for the WiFi modality/standard. The first transceiver 22 and the second transceiver 24 are connected to a front end circuit 26, which in turn is connected to a first antenna 28 and a second antenna 30 via a first antenna port 32 and a second antenna port 34, respectively.

The first transceiver 22 generates an RF signal for transmission to a counterpart remote receiver on a first modality (LTE) transmit output 36. This signal, also referred to as an LTE transmit signal 38, is passed to a first (LTE) power amplifier 40 through a transmit signal input port 42 on the front end circuit 26. As mentioned above, the power level of the LTE transmit signal 38 may be too low for reliable and longer distance RF communications, and is increased by the first power amplifier 40. The first power amplifier 40 is enabled and disabled from a signal generated on a general purpose input/output (GPIO) port 44 of the first transceiver 22. This signal may be referred to as an LTE transmit enable signal 46, and is passed to the first power amplifier 40 via an LTE transmit enable signal input port 48 on the front end circuit 26.

Likewise, the first transceiver 22 typically lacks the sensitivity to detect the received RF signals on the first antenna 28, and the power levels are accordingly increased by a first (LTE) low noise amplifier 50. The amplified signal is passed to an LTE receive signal output port 52 of the front end circuit 26 as an LTE receive signal 54. The LTE receive output port 52 is connected to a first modality (LTE) receive port 56 on the first transceiver 22. To enable and disable signal reception, the first transceiver 22 generates an LTE receive enable signal 60 on a second GPIO port 58 that is passed to the first low noise amplifier 50 via an LTE receive enable input port 62 of the front end circuit 26.

The output of the first power amplifier 40, and the input to the first low noise amplifier 50 are connected to a duplexer 64. More particularly, the duplexer 64 has a first port 66 that is connected to the first power amplifier 40, a second port 68 connected to the first low noise amplifier 50, and a third port 70 connected to the first antenna port 32. As understood, frequency domain duplexing is utilized with the LTE communications modality of the first transceiver 22. Accordingly, signal transmission and reception take place on two different frequencies, and so the first antenna 28 can be simultaneously connected to both the first power amplifier 40 and the first low noise amplifier 50.

The multimode communications system 20 also includes the second transceiver 24, which may be specific to a WiFi communications modality. The front end circuit 26 includes components and features specific to the second transceiver 24 that for the most part correspond to those for the first transceiver 22 described above. In this regard, the second transceiver 24 includes a second (WiFi) modality transmit port 72, as well as a second (WiFi) modality receive port 74. The second transceiver 24 generates a WiFi transmit signal 76 that is passed to a WiFi transmit signal input port 78 of the front end circuit 26 and amplified by a second (WiFi) power amplifier 80. Another GPIO port 82 on the second transceiver 24 outputs a WiFi transmit enable signal 84 and is passed to the second power amplifier 80 via a WiFi transmit enable input port 86.

The power of the signals received via the second antenna 30 is increased by a second (WiFi) low noise amplifier 88, the output of which is connected to a WiFi receive signal output port 90. A received and amplified WiFi receive signal 92 is passed to the second (WiFi) modality receive port 74 of the second transceiver 24. The receive functionality is activated and deactivated based upon a WiFi receive enable signal 94 generated on a GPIO port 96 and passed to a WiFi receive enable input port 98 that is connected to the second (WiFi) low noise amplifier 88.

In contrast to LTE, WiFi utilizes a time domain duplex protocol in which the transmission and reception are on the same frequency, but are alternated in separate time intervals. Accordingly, the second antenna 30 is selectively connected to either the transmit chain or the receive chain at any given point in time. For such selective connectivity, there may be an RF switch 100 with a first port 102 connected to an output of the second power amplifier 80, a second port 104 connected to an input of the second low noise amplifier 88, and a third port 106 connected to the second antenna port 34.

Figure 2:
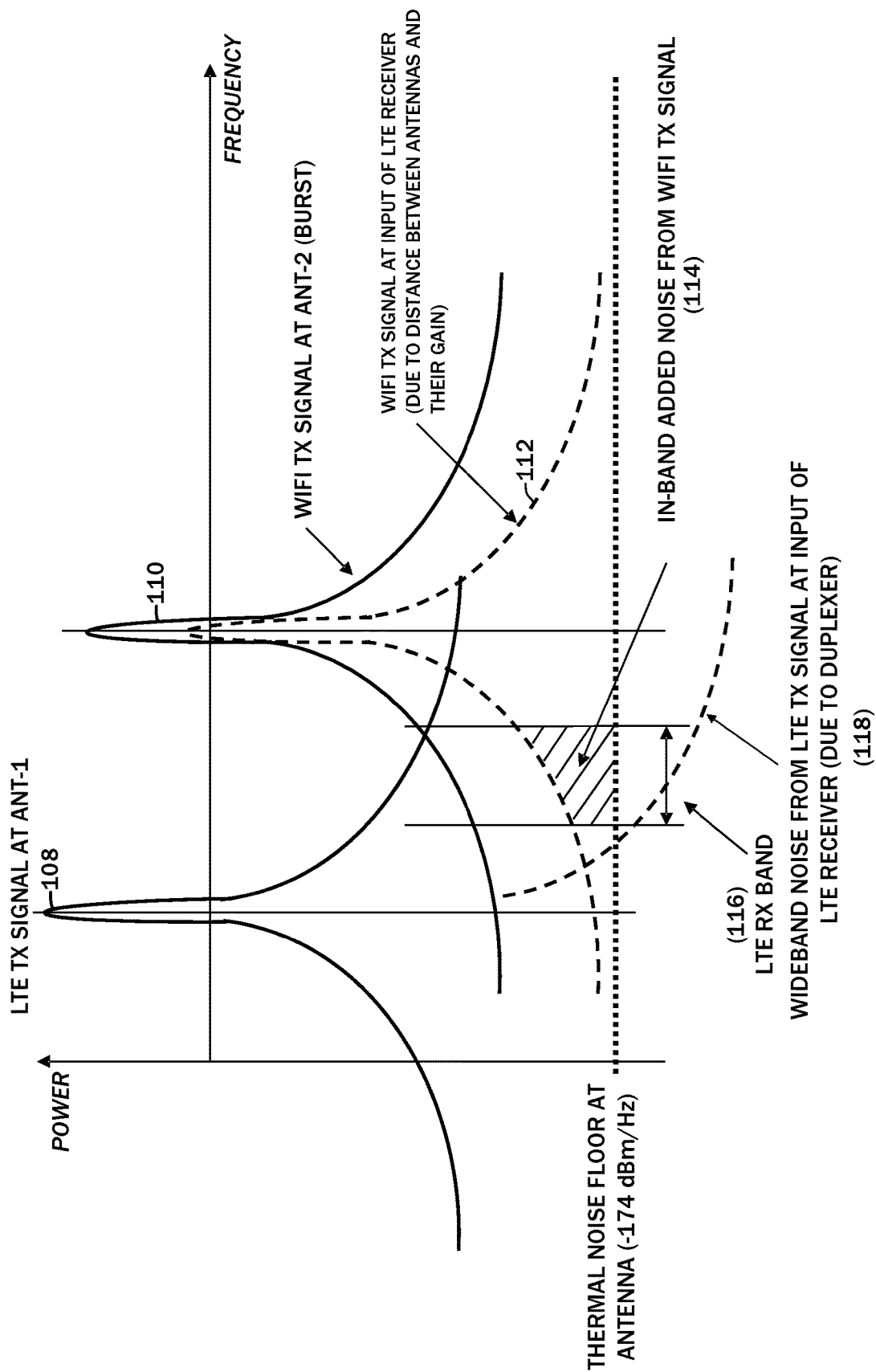
FIG. 2 is a graph showing the frequency spectrum plots of a LTE signal and a WiFi signal, with those overlapping segments being highlighted.

In a multimode handset with simultaneously operating LTE and WiFi subsystems, the degradation of LTE receive sensitivity would preferably be no more than 0.5 to 1.0 dB. As illustrated in the graph of FIG. 2, the WiFi operating frequency band is substantially offset from the LTE operating frequency band. A plot 108 shows a frequency spectrum of the LTE receive signal 54 at the first antenna 28, while a plot 110 shows a frequency spectrum of the WiFi transmit signal 76 at the second antenna 30. More specifically, the LTE receive band is in the range of 2.11 GHz to 2.17 GHz, while the WiFi transmit/receive band is in the range of 2.4 GHz to 2.5 GHz. It will be recognized that the plot 108 represents the highest range of LTE receive bands, and other LTE receive bands are at lower frequencies.

In typical implementations, the first antenna 28 is isolated from the second antenna 30 by approximately 15 dB to 20 dB. A plot 112 shows the frequency spectrum of such a reduced power WiFi transmit signal 76 received or otherwise present on the first antenna 28. Notwithstanding this signal level reduction, without additional filtering the WiFi transmit signal 76 may be too strong and can degrade receiver sensitivity in the LTE chain.

Despite the substantial separation between the center frequencies of WiFi and LTE signals, there may be a coinciding region 114 along the lower shoulder of the WiFi transmit frequency spectrum within which there may be in-band noise including phase noise, modulation spectrum contribution, and so forth that overlaps with an LTE reception band 116. A plot 118 illustrates the frequency spectrum of wideband noise from the LTE transmit signal 38. The duplexer 64 is understood to be able to reduce this noise level by about 6 dB below a thermal noise floor of −174 dBm/Hz. Even with this reduction, the total noise at the LTE receive port 56 may be increased by 1 dB, leading to a corresponding reception sensitivity degradation.

The typical duplexer 64 as may be utilized in the multimode communications system 20 allows the signal level of the LTE transmit signal 38 at a receiver input to be below −180 dBm/Hz, so receive sensitivity may not be degraded. Accordingly, it would be preferable for the added noise power level from the WiFi subsystem during transmit mode operation to be in the range of about −180 dBm/Hz to reduce WiFi receiver sensitivity degradation below 1 dB, though this is also dependent upon the noise figure of the first transceiver 22 in the receive mode. Although the foregoing description was in the context of WiFi transmissions, its applicability to Bluetooth subsystems, especially in the context of class-1 applications involving increased transmission signal power levels, will be appreciated by those having ordinary skill in the art.

Figure 3:
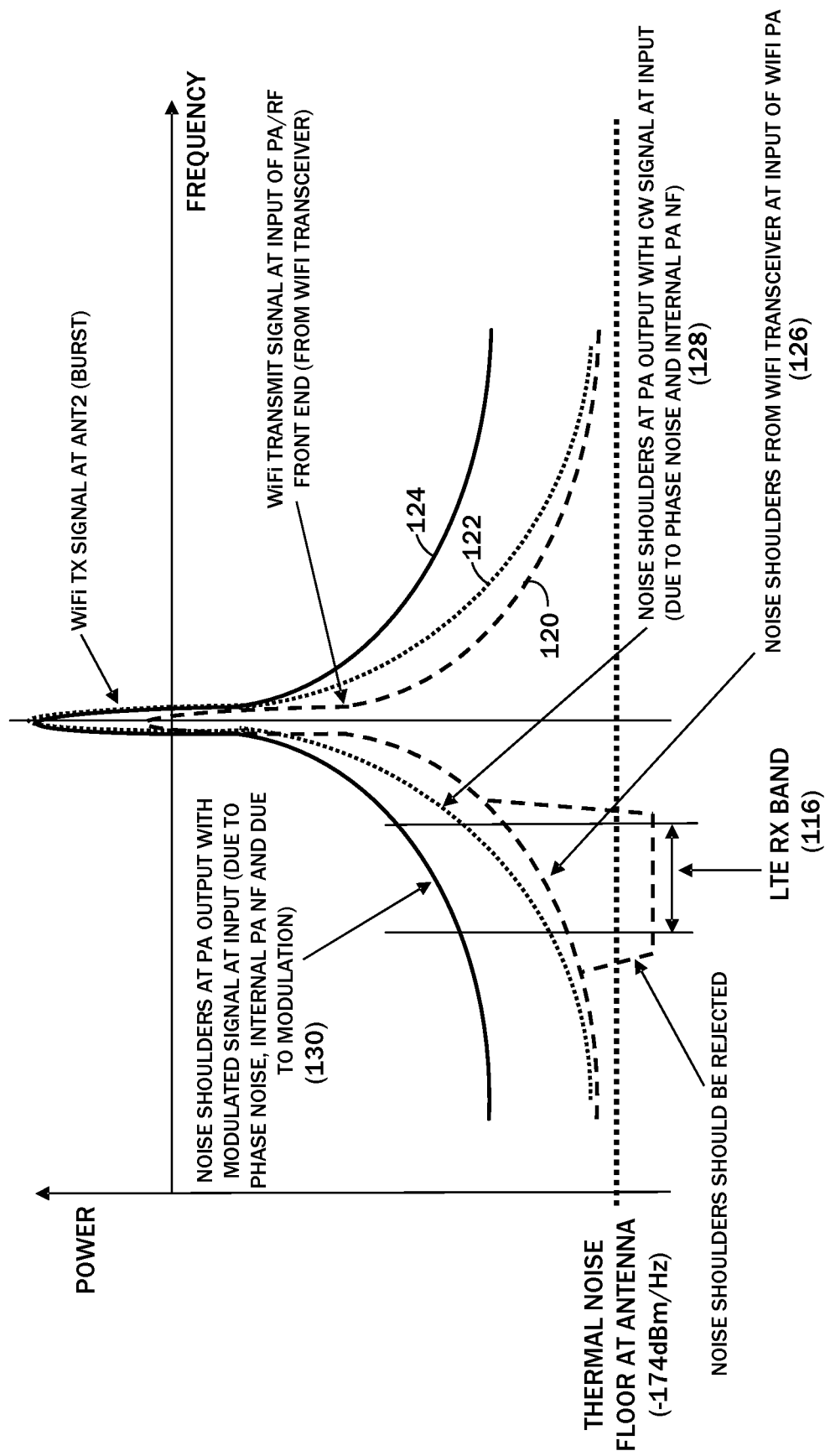
FIG. 3 is a graph showing the frequency spectrum plot of a WiFi transmit signal at the antenna, at the output of the power amplifier, and at the input of the front end circuit.

The graph of FIG. 3 further details the frequency spectrum of the WiFi transmit signal at various stages of the transmit chain. A plot 120 shows the WiFi transmit signal at the input of the WiFi power amplifier 80, as it is being generated by the WiFi transceiver 24 WiFi transmit port 72. A plot 122 shows the WiFi transmit signal at the output of the WiFi power amplifier 80, with an increased output power across the overall frequency band if a continuous wave (CW) signal is passing through the power amplifier. Lastly, a plot 124 shows the WiFi transmit signal at the second antenna 30. As shown on the plot 120, the WiFi transmit signal from the transceiver 24 is characterized by a noise shoulder region 126 that is correspondingly amplified by the WiFi power amplifier 80 and shown in a noise shoulder region 128. It is understood that the output noise contribution of the WiFi power amplifier 80 is directly proportional to the gain at the operating frequency band, e.g., 2.11 GHz to 2.17 GHz. Thus, the lower the gain, the lower the noise contribution. The noise shoulder is understood to be attributable to phase noise and the power amplifier internal noise figure. At the second antenna 30, without attenuation/rejection of the noise shoulder, a further noise shoulder region 130 results as a cumulative effect of the aforementioned phase noise, power amplifier internal noise figure, as well as the carrier signal modulation. The noise characteristics attributable to the signal modulation are understood to be highly dependent on the semiconductor process technology and the configuration of the amplifier circuit itself, particularly relating to such parameters as transducer gain compression, transducer phase compression curvature, and the effect of cross-modulation products.

The present disclosure contemplates the rejection of the noise shoulder region 126 that extends across, and partly beyond the LTE reception band 116. Specifically, a notch filter may be utilized to reduce the noise contribution at the noise shoulder region 126. The lower the noise figure of the WiFi power amplifier 80, the lower the internal noise contribution at its output. Thus, the present disclosure contemplates the placement of the notch filter after the first stage of the WiFi power amplifier 80.

Figure 4:
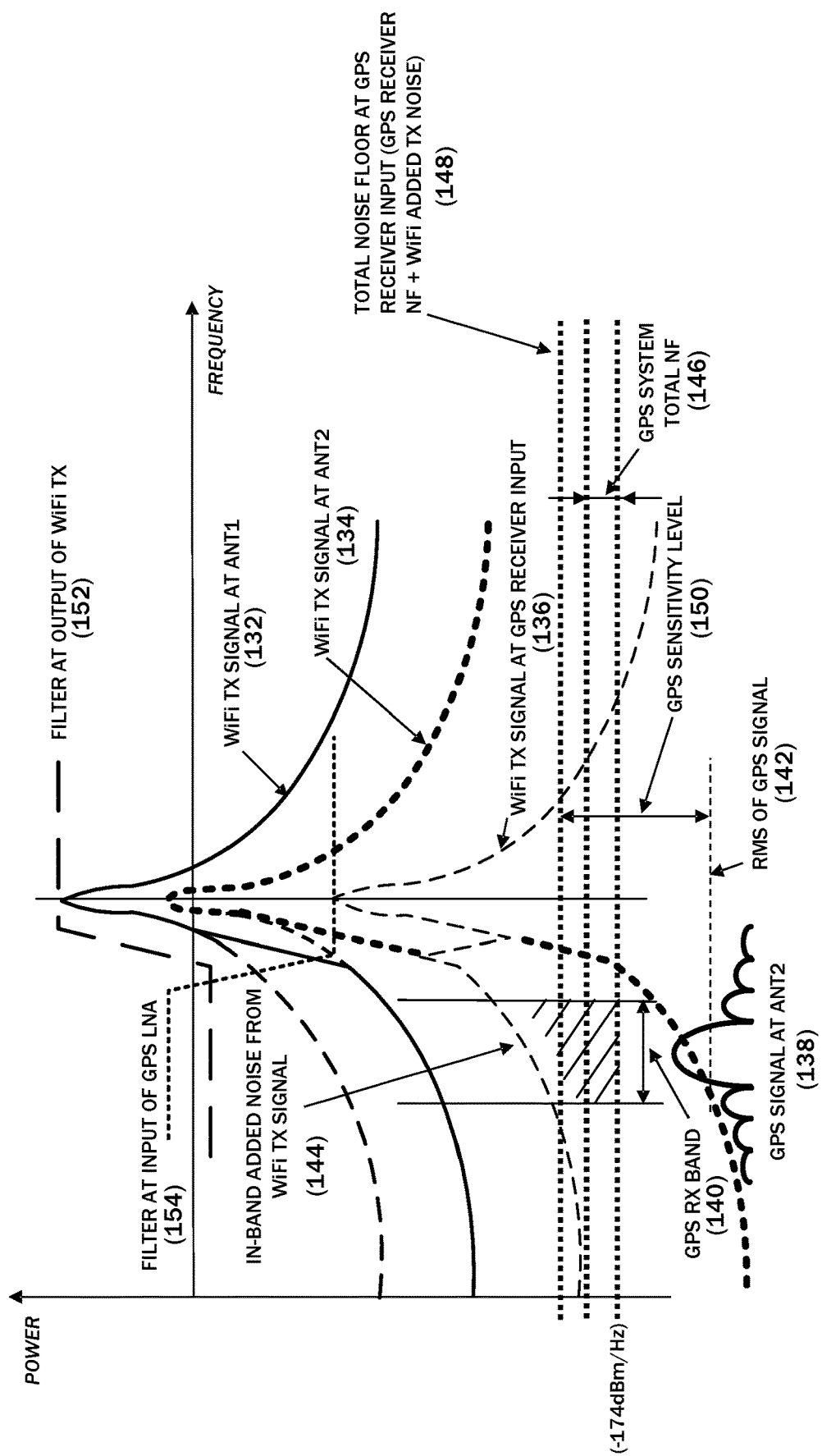
FIG. 4 is a graph showing the frequency spectrum plot of the WiFi transmit signal at the antenna, at the output of the power amplifier, and at the input of the front end circuit relative to received GPS signal.

FIG. 4 illustrates the frequency spectrum of the WiFi transmit signal at additional points in the multimode communications system 20, specifically showing the potential overlap with GPS receive signals. Similar to the graph of FIG. 3 discussed above, a plot 132 shows the frequency spectrum of the WiFi transmit signal at the first antenna 28, and a plot 134 shows the frequency spectrum of the WiFi transmit signal at the second antenna 30. Additionally, a plot 136 shows the frequency spectrum of the WiFi transmit signal at the input of the GPS receiver. The GPS receive signal is shown in a plot 138 with a GPS receive band 140 and RMS (root-mean-square) value plot 142 of the GPS receive signal being overlaid thereon.

As shown in a region 144, in-band noise attributable to the WiFi transmit signal may be present within the GPS receive band 140. The noise power level per unit of bandwidth (1 Hz) above the thermal noise floor of −174 dBm/Hz corresponding to the noise figure of the GPS system is shown in a plot 146, and a total noise floor of the GPS receiver is understood to be defined by the GPS receiver noise figure and the added WiFi transmit noise, which is shown in a plot 148. The noise power level between this upper limit and the RMS value of the GPS signal (shown in plot 142) is understood to define the sensitivity level 150 of the GPS system. With the application of filters at both the output of the WiFi transmit and at the input of a GPS low noise amplifier, the noise shoulder resulting from the in-band WiFi transmit signal may be reduced. The response curve of the filter at the output of the WiFi transmitter is shown in a plot 152, while the response curve of the filter at the input of the GPS low noise amplifier is shown in a plot 154.

Figure 5:
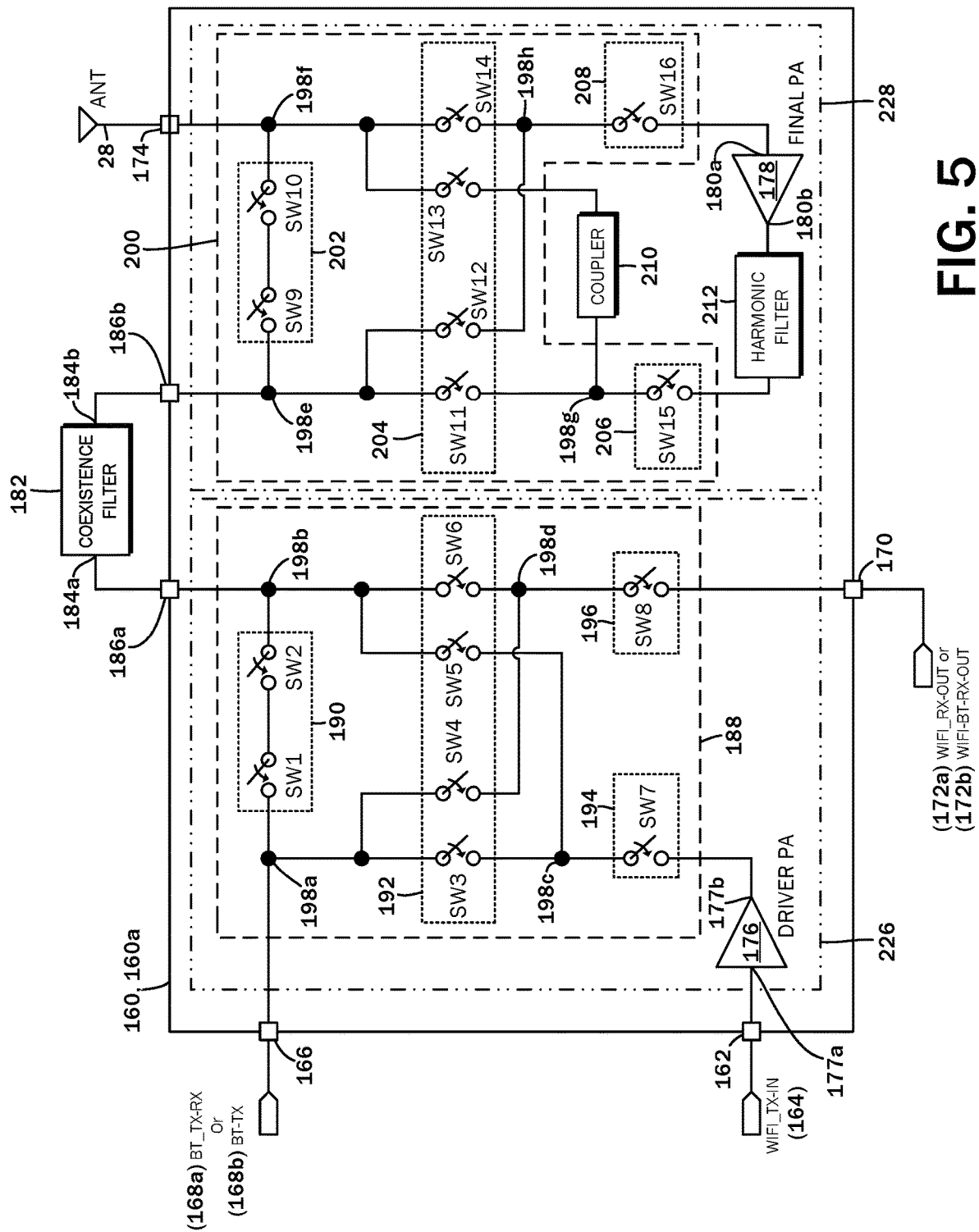
FIG. 5 is a schematic diagram of a first embodiment of a front end circuit of the present disclosure.

The schematic diagram of FIG. 5 depicts a first embodiment of a front end circuit 160*a* that operates together with a multimode transceiver and is part of a multimode communication system such as a mobile handset or other wireless communication device. The multimode transceiver is understood to be configured for WiFi and Bluetooth communication, cellular/mobile network communications such as LTE, as well as reception of GPS signals. In this regard, the term multimode is understood to refer to such WiFi communication mode, Bluetooth communication mode, LTE communications mode, GPS reception mode, and so on. These communication modes may also be generally referred to as an operating mode, with the specific reception function or transmission function being referred to as function modes, e.g., a WiFi operating mode in a transmit function mode.

As the front end circuit 160 operates together with the multimode transceiver, it is understood to have equivalent or corresponding operating and function modes. Thus, when the transceiver is in a specific operating and function mode, so is the front end circuit 160. As an example, when the transceiver is outputting a WiFi transmit signal, then the front end circuit 160 amplifies the signal and passes the same to the antenna connected thereto. The operation of the front end circuit 160 in such case will be referenced in the same terms, e.g., a WiFi operating mode in a transmit function mode.

The first embodiment of the front end circuit 160a is configured for a single band, dual mode (WiFi-Bluetooth) transceiver. Accordingly, there is a WiFi transmit input port 162 that is in electrical communication with a corresponding connection from a WiFi transceiver (WiFi_TX-IN 164). The WiFi transmit input port 162 may also be referred to generally as a first transmit mode input port. Furthermore, there is a Bluetooth transmit input/receive output port 166, also referred to as a second operating mode transmit input/receive output port. Different configurations of multimode transceivers, and specifically the Bluetooth transceiver subsystems thereof are understood to have bi-directional input/output ports, or separate transmit output ports and receive input ports. In order to accommodate both, the front end circuit 160a may be connectible to either such combination transmit-receive connection (BT_TX-RX 168a) or transmit connection (BT_TX 168b). The front end circuit 160a further has a hybrid WiFi/Bluetooth receive output port 170. Again, depending on the configuration of the multimode transceiver, the WiFi receive connection may be independent (WiFi_RX-OUT 172a), or it may be shared with the Bluetooth receive connection (WiFi-BT_RX-OUT 172b). The WiFi/Bluetooth receive output port 170 may also be referred to as a hybrid first and second operating mode receive output port.

As may be suggested by the alternative, broader descriptors of the aforementioned ports of the front end circuit 160, the present disclosure need not be limited to the WiFi operating mode or the Bluetooth operating mode. Any other suitable wireless communications modality may be substituted, and suitable modifications to the components of the front end circuit that adapts the operation of the front end circuit 160 to such alternative communications modalities being within the purview of those having ordinary skill in the art.

The front end circuit 160a is connected to the antenna 28, and so there is an antenna port 174. In this embodiment, the antenna 28 is understood to be tuned for both WiFi and Bluetooth signals in the 2.4 GHz band. The signal level of the transmit signals for both operating modes may be increased by one or more common or shared amplifier circuits at different time segments, with the antenna 28 transducing the amplified signal to radio waves that are broadcast to the air. The radio signals received on the antenna 28 are likewise transduced to electrical signals, which are then amplified by the same amplifier circuitry in the front end circuit 160a to be further processed by the multimode transceiver. In further detail, the front end circuit 160a includes a driver power amplifier 176 with an input 177a that is connected solely to the WiFi transmit input port 162. In this regard, the driver power amplifier 176 is understood to be an initial amplification stage of the WiFi transmit chain.

Additionally, there is a final power amplifier 178 that may serve multiple roles. One such role may be a second or final stage of the WiFi transmit signal, in which the power level of the amplified WiFi signal from the driver power amplifier 176 is further increased before being passed to the antenna port 174 and transduced by the antenna 28. Another role may be to increase the power level of the Bluetooth transmit signal as provided by the Bluetooth transceiver via the Bluetooth transmit input/receive output port 166 before being passed to the antenna port 174 and transduced by the antenna 28. The final power amplifier 178 may also be utilized as a low noise amplifier that increases the power level of the incoming signal received by the antenna 28, whether in the first operating mode (WiFi) or the second operating mode (Bluetooth). Thus, the final power amplifier 178 may be tuned for a low noise figure.

The embodiments of the present disclosure contemplate minimizing interference with LTE and GPS signal reception resulting from WiFi and Bluetooth transmissions originating from adjacent antennas on the same device, and one possible modality by which this may be achieved is the filtering of noise between amplification stages. Thus, the first embodiment of the front end circuit 160a includes a coexistence filter 182 with a first port 184a and a second port 184b. The coexistence filter 182 is understood to be a component that is external to the front end circuit 160a, and may be implemented as a low temperature co-fired ceramic (LTCC) device, a surface acoustic wave (SAW) device, bulk acoustic wave (BAW) device, a microelectronic-mechanical system (MEMS) device, or any other suitable passive or active component filtering modality. The front end circuit 160a itself has coexistence filter first port 186a that is connected to the first port 184a, and a coexistence filter second port 186b that is connected to the second port 184b.

Because the final power amplifier 178 may be part of both the transmit and receive chains, and because the antenna ports and transceiver interconnect ports may be bi-directional, one or more switch networks are contemplated to make the suitable interconnections between the various ports and front end circuit components for each operating and function modes. In the illustrated embodiment, the driver power amplifier 176 is utilized while the front end circuit 160a is in the WiFi transmit function mode, and so the WiFi transmit input port 162 may be unidirectional. The Bluetooth transmit input/receive output port 166 and the hybrid WiFi/Bluetooth receive output port 170 are bi-directional, however, one or more switch networks are also contemplated to make the suitable interconnections between the ports and front end circuit components for each operating and function modes.

The first embodiment of the front end circuit 160a therefore includes a first switch network 188 with one or more switch elements that together selectively connect the coexistence filter first port 186a to the WiFi transmit input port 162 (the first operating mode transmit input port) via the driver power amplifier 176, the Bluetooth transmit input/receive output port 166 (the second operating mode transmit input/receive output port), and the hybrid WiFi/Bluetooth receive output port 170 (the hybrid first and second operating mode receive output port).

Whether in the transmit function mode or the receive function mode, the antenna 28 and the antenna port 174 are indirectly connected to the coexistence filter 182 and the coexistence filter second port 186b. A transmit signal may thus be passed from the coexistence filter second port 186b to the antenna port 174, or a receive signal may be passed from the antenna port 174 to the coexistence filter second port 186b. The direction in which the final power amplifier 178 is connected between the coexistence filter second port 186b and the antenna port 174 may be reversed depending on the function mode, that is, the final power amplifier 178 may be forwardly connectible to the antenna port 174, where an output 180b is connected to the antenna port 174, or reversely connectible to the antenna port 174 where, an input 180a is connected to the antenna port 174. To this end, the first embodiment of the front end circuit 160a includes a second switch network 200 that selectively connects the coexistence filter second port 186b to the antenna port 174.

As shown in the schematic diagram of FIG. 5, the first switch network 188 is comprised of eight single pole, single throw switches SW1, SW2, SW3, SW4, SW5, SW6, SW7, and SW8 connected in a particular configuration, with specific sets of such switches being connected and disconnected to define a contiguous electrical signal path from the respective WiFi transmit input port 162, the Bluetooth transmit input/receive output port 166, and the Hybrid WiFi/Bluetooth receive output port 170 to the coexistence filter first port 186a. Thus, the first switch network 188 is defined by a first subsegment 190, a second subsegment 192, a third subsegment 194, and a fourth subsegment 196. The Bluetooth transmit input/receive output port 166 is common with a first network junction 198a, to which the first subsegment 190 is connected. Furthermore, the first subsegment 190 is also connected to a second network junction 198b that is common with the coexistence filter first port 186a. The first subsegment 190 includes the switch SW1 that is connected in series with the switch SW2. The first subsegment 190 is contemplated to have a high degree of isolation when disconnected, so the disclosed embodiment utilizes two separate single pole, single throw switches SW1 and SW2. However, to the extent a single switch may meet the contemplated isolation parameters, the first subsegment 190 may be implemented with a single switch, that is, substituting SW1 and SW2 with one switch. Where there are two single pole, single throw switches, both may be connected and disconnected concurrently to perform the delegated function of the first subsegment 190, as will be described in further detail below.

The second subsegment 192 includes the four single pole, single throw switches SW3, SW4, SW5, and SW6 connected in a proscribed configuration. In particular, the pole terminal of SW3 and the pole terminal of SW4 are connected to the first network junction 198a, while the pole terminal of SW5 and the pole terminal of SW6 are connected to the second network junction 198b. The throw terminal of SW3 is connected to a third network junction 198c, as is the throw terminal of SW5. The throw terminal of SW4 and the throw terminal of SW6 are connected to a fourth network junction 198d. Depending on the activated connection mode, different ones or sets of the switches in the second subsegment 192 are connected and disconnected to establish the functional interconnections of each mode. Though specific reference is made to pole terminals and throw terminals, this is for illustrative purposes only. Whether a pole terminal or a throw terminal is connected to a given network junction is immaterial with a single pole, single throw switch, and such reference is only being made only to conform to the switch networks as depicted in the drawings.

The first switch network 188 includes the third subsegment 194 that generally corresponds to the switch SW7, and the fourth subsegment 196 that generally corresponds to the switch SW8. The switch SW7 is connected to the third network junction 198c and the output 177b of the driver power amplifier 176. In this regard, the fourth subsegment 196 SW7 generally functions to selectively connect and disconnect the driver power amplifier 176 to/from the rest of the first switch network 188. Along the same lines, the switch SW8 is connected to the fourth network junction 198d and the hybrid WiFi/Bluetooth receive output port 170. As such, the fourth subsegment 196 SW8 generally functions to selectively connect and disconnect the hybrid WiFi/Bluetooth receive output port 170 to/from the rest of the first switch network 188.

Still referring to the schematic diagram of FIG. 5, the second switch network 200 is similarly comprised of eight single pole, single throw switches SW9, SW10, SW11, SW12, SW13, SW14, SW15, and SW16 connected in a particular configuration, with specific sets of such switches being connected and disconnected to define a contiguous electrical signal path to/from the antenna port 174 and the coexistence filter second port 186b, either through or bypassing the final power amplifier 178. Similar to the first switch network 188, the second switch network 200 is defined by a first subsegment 202, a second subsegment 204, a third subsegment 206, and a fourth subsegment 208.

The coexistence filter second port 186b is common with a fifth network junction 198e, to which the first subsegment 202 is connected. The first subsegment is also connected to a sixth network junction 198f that is common with the antenna port 174. The first subsegment 202 includes the switch SW9 that is connected in series with the switch SW10. Again, like the first subsegment 190 of the first switch network 188, this first subsegment 202 is contemplated to have a high degree of isolation when disconnected, so the disclosed embodiment utilizes two separate single pole, single throw switches SW9 and SW10. To the extent a single switch may meet the contemplated isolation parameters, the first subsegment 202 may be implemented with a single switch, that is, substituting SW1 and SW2 with one switch. Where there are two single pole, single throw switches, both may be connected and disconnected concurrently to perform the delegated function of the first subsegment 202

The second subsegment 204 includes the four single pole, single throw switches SW11, SW12, SW13, and SW14 connected in a proscribed configuration. In particular, the pole terminal of SW11 and the pole terminal of SW12 are connected to the fifth network junction 198e, while the pole terminal of SW13 and the pole terminal of SW14 are connected to the sixth network junction 198f. The throw terminal of SW11 is connected to a seventh network junction 198g, as is the throw terminal of SW13. Interposed between the throw terminal of SW13 and the seventh network junction 198g may be a directional coupler 210. According to the embodiments of the present disclosure, the directional coupler 210 may be utilized for signal detection purposes during transmit mode operations. The detected transmit signal may be utilized for calibrating the power output of the entire transmit chain, or for closed-loop power control of the entire multimode communications system 20. Although the directional coupler 210 is part of an electrical signal path that are a part of the second switch network 200, by itself it may not necessarily be incorporated as a constituent part thereof. Continuing with the features of the second subsegment 204, the throw terminal of SW12 and the throw terminal of SW14 are connected to an eighth network junction 198h. Depending on the activated connection mode, different ones or sets of the switches in the second subsegment 192 are connected and disconnected to establish the functional interconnections of each mode.

The second switch network 200 includes the third subsegment 206 that generally corresponds to the switch SW15 and the fourth subsegment 208 that generally corresponds to the switch SW16. The input of 180a of the final power amplifier 178a is connected to the switch SW16, with the output 180b being connected to a harmonic filter 212. The output of the harmonic filter 212 is connected to the switch SW15. The harmonic filter 212 may be configured to reject portions of the transmitted signal that constitute harmonics of the main transmit signal. Because the harmonic filter 212 is configured to reject signals that are many multiples of the fundamental transmit signal frequency, power loss may be substantially less in comparison to filters that are configured for closer filtered versus passed frequencies. The attenuation level is understood to be in accordance with the limits of harmonic emissions that are legally mandated by jurisdiction-specific regulatory agencies. The attendant power loss is understood to be in the range of 0.5 dB to 1.0 dB. The switches SW15 and SW16 generally operate to connect and disconnect the final power amplifier 178 and the harmonic filter 212 from the second switch network 200. As briefly mentioned above, the second subsegment 204 functions to forwardly and reversely connect the final power amplifier 178 and the harmonic filter to the coexistence filter second port 186b and the antenna port 174.

The coexistence filter 182 is envisioned to reject noise components of the transmit signal that are introduced in the Bluetooth transmit chain and the WiFi transmit chain. As discussed above, such noise may deteriorate the reception sensitivity of the LTE receiver and/or the GPS receiver, particularly when these components are all on a single device, e.g., a mobile handset/smartphone, and utilize closely positioned antennas. The placement of the coexistence filter 182 between the driver power amplifier 176 and the final power amplifier 178 is contemplated to reduce overall power loss between the antenna 28 and the final power amplifier 178. Additionally, there is understood to be a significant reduction in current consumption over the entirety of the front end circuit 160. With the coexistence filter 182 being external to the front end circuit 160, a high level of rejection at specific frequencies is possible. To the extent high loss between closely positioned frequencies is needed, such as between the 2117 MHz LTE receive frequency and the 2402 MHz Bluetooth transmit frequency, the transmit signal power loss associated with the coexistence filter 182 may be 1.5 dB to 3 dB.

In accordance with various embodiments of the present disclosure, the foregoing components of the front end circuit 160, including the driver power amplifier 176, the final power amplifier 178, the directional coupler 210, the harmonic filter 212, and the switches SW1-SW16 may be fabricated on a single semiconductor die substrate. The switches may be fabricated with any suitable semiconductor technology, including Complementary Metal Oxide Semiconductor (CMOS), Silicon-on-Insulator (SOI), High Electron Mobility Transistor (HEMT), and Pseudomorphic High Electron Mobility Transistor (PHEMT), and so on. Furthermore, the driver power amplifier 176 and the final power amplifier 178 may be fabricated with semiconductor technology suitable therefor, including CMOS, SOI, Silicon Germanium (SiGe), and Gallium Arsenide (GaAs) Heterojunction Bipolar Transistor (HBT), and so on. Those having ordinary skill in the art will recognize the benefits and compromises of each while being able to select a suitable semiconductor fabrication technology for a given application. Preferably, however, the final power amplifier 178 may be implemented with CMOS because maximum modulation noise rejection at closely positioned frequencies has been achieved therewith.

Figure 6A:
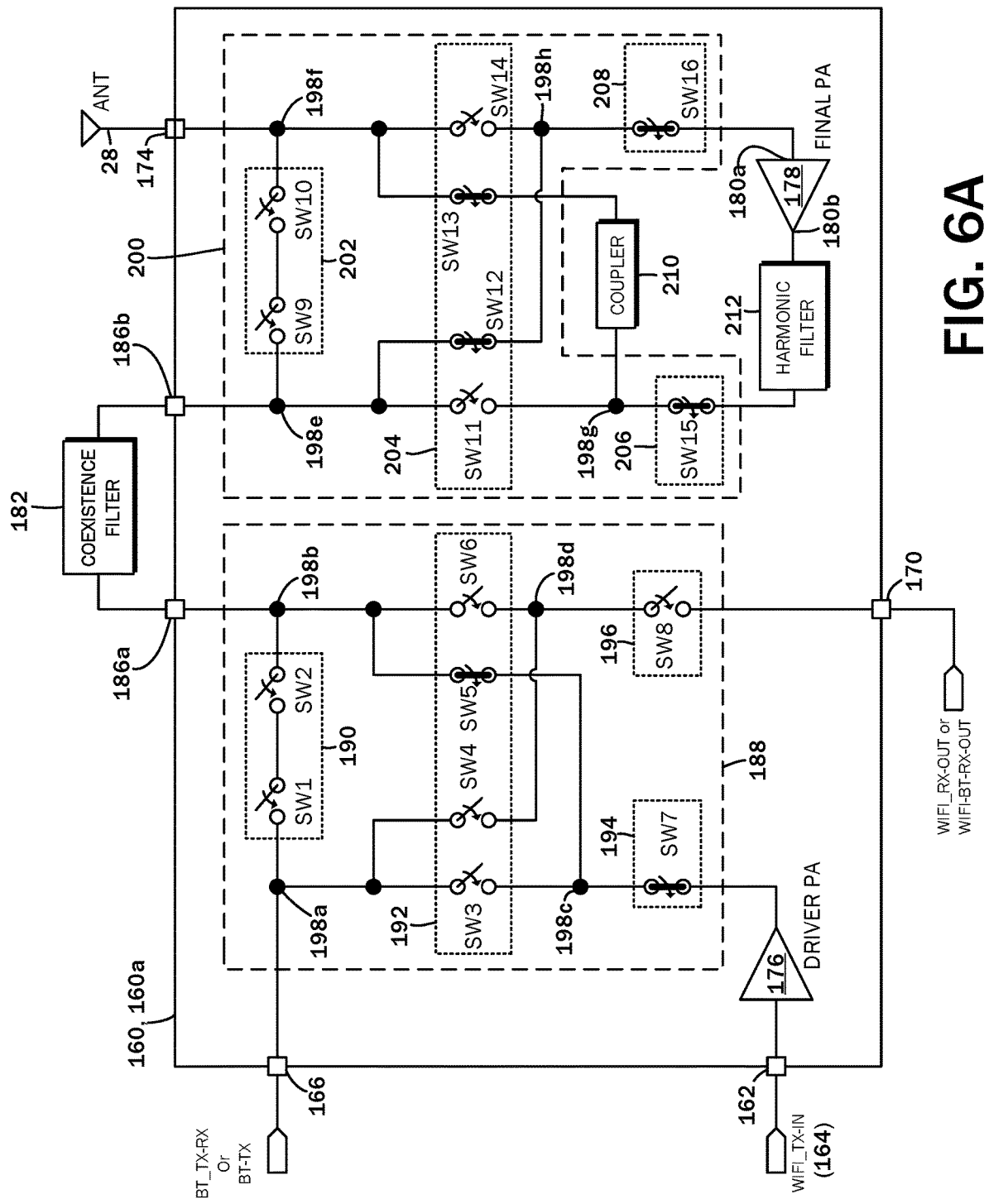
FIG. 6A is a schematic diagram of the first embodiment of the front end circuit with switch connections in a first/WiFi high power transmit operating mode.

With reference to the schematic diagrams of FIGS. 6A-6G, the various operating and function modes of the first embodiment of the front end circuit 160a will now be considered. FIG. 6A specifically illustrates the connections made in the first switch network 188 and the second switch network 200 to enable a first mode in which the WiFi operating mode and the transmit function mode is activated. This may also be referred to as a high power mode, since the maximum amplification of the transmit signal is being applied by both the driver power amplifier 176 and the final power amplifier 178. In this regard, a WiFi transmit signal provided to the WiFi transmit input port 162 is amplified by the driver power amplifier 176 and passed to the first switch network 188. The switch SW7/third subsegment 194 is enabled or connected, and the amplified WiFi transmit signal reaches the third network junction 198c. In the second subsegment 192, the switch SW5 is enabled or connected, passing the signal to the second network junction 198b and thus the coexistence filter first port 186a.

The first subsegment 190, that is, the switches SW1 and SW2, are disabled or disconnected, thus isolating the second network junction 198b from the first network junction 198a and the Bluetooth transmit input/receive output port 166. Preferably, though optionally, the configuration of the switches SW1 and SW2 are such that, when disabled, the isolation across the series chain thereof is at least 5 to 10 dB higher than the gain of the driver power amplifier 176 If one configuration of a switch achieves the same levels of isolation as contemplated, then a single switch may replace the two switches SW1 and SW2.

The remaining switches in the second subsegment 192 are also disabled or disconnected, including the switches SW3, SW4, and SW6. The disconnected SW3 isolates the third network junction 198c (on which the transmit signal is present) from the first network junction 198a. The switch SW4 together with the switch SW6 further isolates the transmit signal at the second network junction 198b from the first network junction 198a. Lastly, the disconnected fourth subsegment 196/SW8 isolates the hybrid WiFi/Bluetooth receive output port 170.

The unwanted frequency components are rejected by the coexistence filter 182, and the resultant WiFi transmit signal is passed to the coexistence filter second port 186b. The various subsegments of the second switch network 200 are connected such that the final power amplifier 178 amplifies the signal from the driver power amplifier 176 and outputs the resultant signal to the antenna 28. Accordingly, certain switch connections in the second subsegment 204 are enabled, as are the third subsegment 206/switch SW15 and the fourth subsegment 208/SW16. The first subsegment 202, that is, the switches SW9 and the SW10, is disconnected, isolating the fifth network junction 198e/coexistence filter second port 186b from the sixth network junction 198f/ antenna port 174. Again, preferably, though optionally, the configuration of the switches SW9 and SW10 are such that, when disabled, the isolation across the series chain thereof is at least 5 to 10 dB higher than the gain of the driver power amplifier 176 and the final power amplifier 178. If one configuration of a switch achieves the same levels of isolation as contemplated, then a single switch may replace the two switches SW9 and SW10.

With respect to the second subsegment 204, the switch SW12 interconnects the fifth network junction 198*e* (and hence the filtered transmit signal from the coexistence filter 182) to the eighth network junction 198*h*, which in turn is connected to the input 180*a* of the final power amplifier 178 over the fourth subsegment 208/SW16 that is also enabled or connected. The further amplified transmit signal is output to the harmonic filter 212 and passed to the seventh network junction over the connected or enabled third subsegment 206/switch SW15. The fully amplified transmit signal is passed through the directional coupler, and to the sixth network junction 198*f* and the antenna port 174 over another connection in the second subsegment 204, switch SW13. The switch SW11 is disabled or disconnected, isolating the seventh network junction 198*g* from the fifth network junction 198*e*. Similarly, the switch SW14 is disabled or disconnected, isolating the sixth network junction 198*f* from the eighth network junction 198*h*.

Figure 6B:
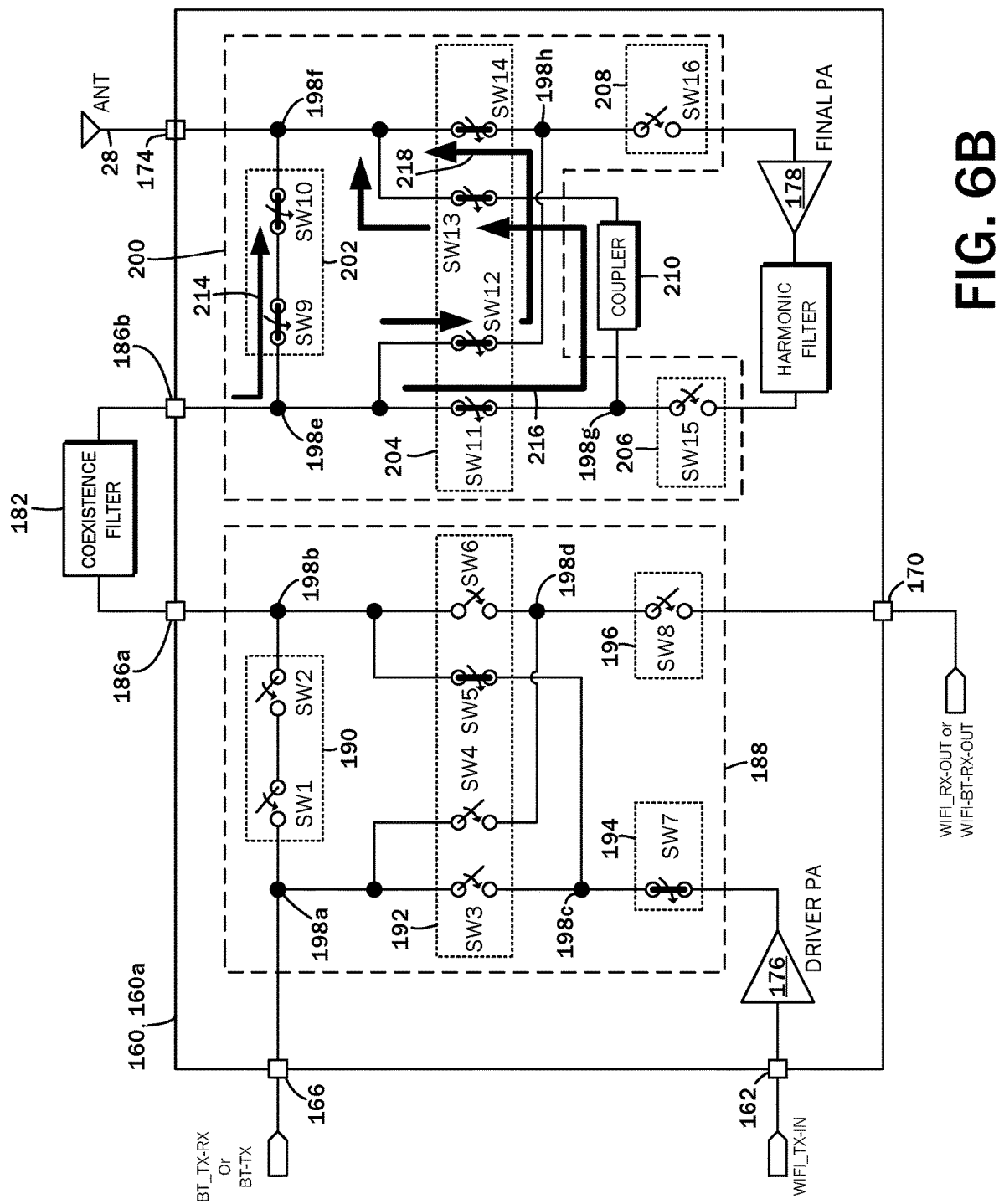
FIG. 6B is a schematic diagram of the first embodiment of the front end circuit with switch connections in a second/WiFi low power transmit operating mode.

FIG. 6B illustrates the connections made in the first switch network 188 and the second switch network 200 that enable a second mode in which the WiFi operating mode and the transmit function mode is activated. In the second mode, however, only the driver power amplifier 176 is active, and the final power amplifier 178 is disabled. This may also be referred to as a low power mode, and the overall gain of the WiFi transmit chain is reduced, and the power level of the signal radiated from the antenna 28 is likewise reduced. This mode has the advantage of reduced current consumption from the DC bias supply.

In the second mode, the same connections as in the first mode are enabled in the first switch network 188, that is, enabling or connecting the switch SW5 of the second subsegment 192 and the third subsegment 194/switch SW7, while disabling or disconnecting the others, including those of the first subsegment 190 (switches SW1 and SW2), the switches SW3, SW4, and SW6 of the second subsegment 192, and the fourth subsegment 196/switch SW8. The WiFi transmit signal is provided to the WiFi transmit input port 162 and amplified by the driver power amplifier 176 and passed to the first switch network 188. The signal passes through the enabled or connected switch SW7, reaching the third network junction 198*c*. From there, the signal passes through the enabled or connected switch SW5 and to the second network junction 198*b* and thus the coexistence filter first port 186*a*. The isolation of different network junctions 198 as a consequence of the disabled or disconnected switches have been described above in the context of the first mode and will not be repeated for the sake of brevity.

The unwanted frequency components are rejected by the coexistence filter 182, and the resultant WiFi transmit signal is passed to the coexistence filter second port 186*b*. As indicated above, the final power amplifier 178 is disabled and disconnected from the second switch network 200. The third subsegment 206/switch SW15 and the fourth subsegment 208/switch SW16 are likewise disabled and disconnected. The switches of the first subsegment 202 and the second subsegment 204 are activated to connect the fifth network junction 198*e*, that is, the coexistence filter second port 186*b*, to the sixth network junction 198*f*, that is, the antenna port 174.

Three switch chains for this purpose are contemplated, each of which are connected in parallel to each other. The multiple chain, parallel connection is contemplated to minimize losses between the fifth network junction 198*e* and the sixth network junction 198*f*. The first of these three switch chains is a first switch chain 214 over the first subsegment 202, and specifically the switches SW9 and SW10. The second and third of the three switch chains is over the second subsegment 204. A second switch chain 216 is that which is across the enabled or connected switches SW11 and SW13, with the directional coupler 210 interposed between with the intermediary node of the seventh network junction 198*g*. A third switch chain 218 is that which is across the enabled or connected switches SW12 and SW14 over the intermediary node of the eighth network junction 198*h*.

The WiFi transmit signal that has been amplified by the driver power amplifier 176 with the unwanted noise components removed by the coexistence filter 182 is passed from the coexistence filter second port 186*b* over each of the first switch chain 214, second switch chain 216, and the third switch chain 218. Such parallel connection is understood to significantly reduce losses between the fifth network junction 198*e* and the sixth network junction 198*f*.

Figure 6C:
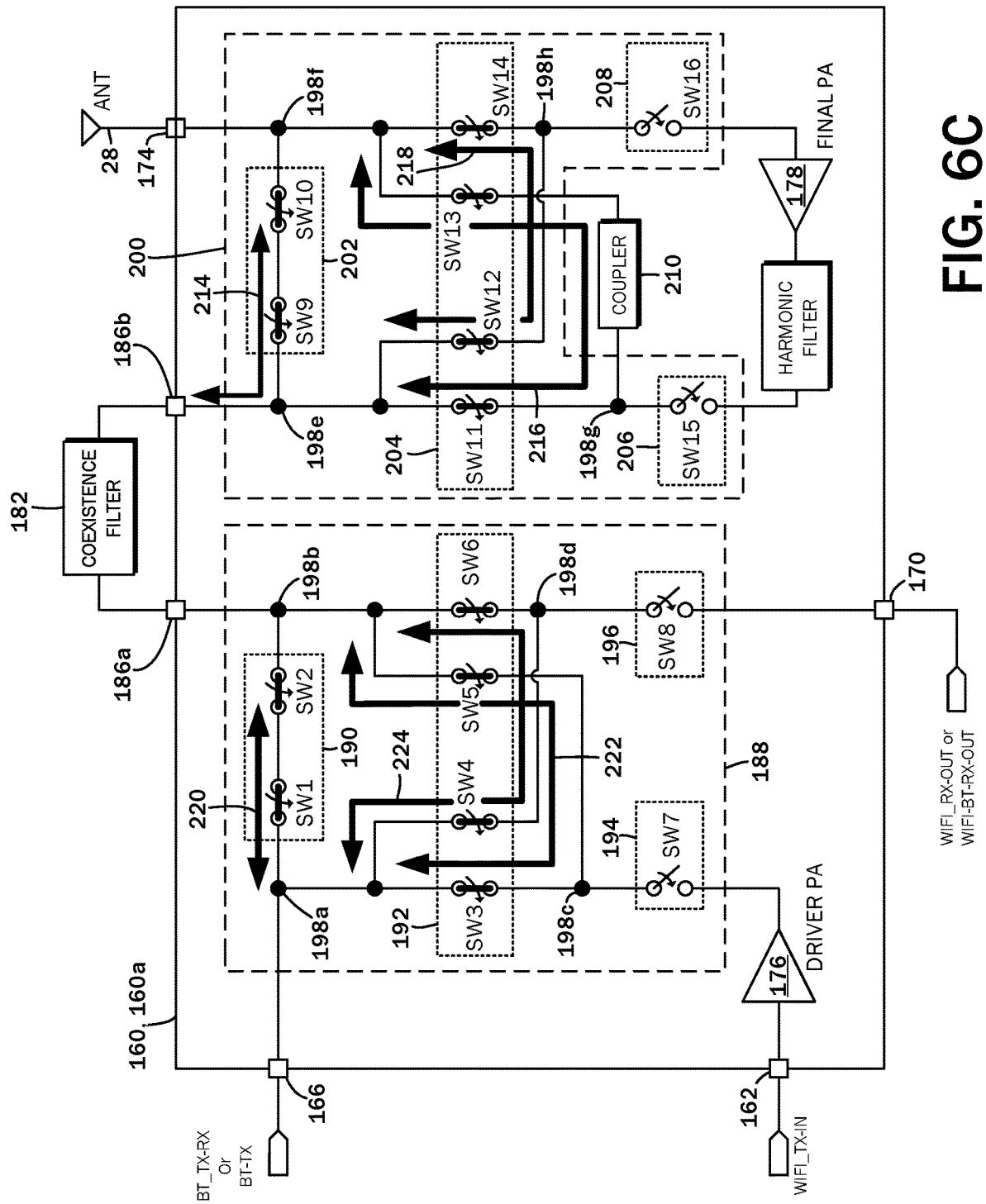
FIG. 6C is a schematic diagram of the first embodiment of the front end circuit with switch connections in a third/Bluetooth low power transmit and receive operating mode.

FIG. 6C illustrates the connections made in the first switch network 188 and the second switch network 200 that enable a third mode in which the Bluetooth operation mode is activated, and both the transmit and receive function modes are activatable. In the third mode, the driver power amplifier 176 and the final power amplifier 178 are disabled. Because neither of the power amplifiers are utilized, this may be referred to as low power mode.

In the third mode, the first switch network 188 enables connections similar to the second switch network 200 in the second mode, discussed above. The third subsegment 194/switch SW7 disconnects the driver power amplifier 176 from the first switch network 188, and likewise, the fourth subsegment 196/switch SW8 disconnects the hybrid WiFi/Bluetooth receive output port 170 from the first switch network 188. The first subsegment 190 and the second subsegment 192 are operated together to connect the first network junction 198*a* (which is contiguous with the Bluetooth transmit input/receive output port 166) to the second network junction 198*b* (which is contiguous with the coexistence filter first port 186*a*).

Like the first subsegment 202 and the second subsegment 204 of the second switch network 200 in the second mode, three switch chains in the first subsegment 190 and the second subsegment 192 are established, each of which are connected in parallel to each other. There is a first switch chain 220 over the first subsegment 190, and specifically the switches SW1 and SW2. The second and third of the three switch chains is over the second subsegment 204. A second switch chain 222 is that which is across the enabled or connected switches SW3 and SW5 and through the intermediary node of the third network junction 198*c*. A third switch chain 224 is that which is across the enabled or connected switches SW4 and SW6 over the intermediary node of the fourth network junction 198*d*. The multiple chain, parallel connection is contemplated to minimize losses between the second network junction 198*b* and the first network junction 198*a*.

The same connections in the second switch network 200 as in the second mode are enabled in the third mode. Again, the final power amplifier 178 is disabled and disconnected from the second switch network 200. The third subsegment 206/switch SW15 and the fourth subsegment 208/switch SW16 are likewise disabled and disconnected. The switches of the first subsegment 202 and the second subsegment 204 are activated to connect the fifth network junction 198*e*, that is, the coexistence filter second port 186*b*, to the sixth network junction 198*f*, that is, the antenna port 174. The connections of the first switch chain 214, the second switch chain 216, and the third switch chain 218 are applied in this mode as well, though the details thereof will not be repeated.

The third mode is understood be bi-directional and may be utilized for both transmit and receive operations. In the transmit function mode, the signal applied to the Bluetooth transmit input/receive output port 166 is passed from the first network junction 198*a* to the second network junction 198*b* over the aforementioned first switch chain 220, second switch chain 222, and the third switch chain 224. The unwanted frequency components are rejected by the coexistence filter 182, and the Bluetooth transmit signal is passed to the coexistence filter second port 186*b*, where it is passed from the fifth network junction 198*e* to the sixth network junction 198*f* over the aforementioned first switch chain 214, second switch chain 216, and third switch chain 218. In the receive functional mode, the received signal on the antenna 28 traverses the reverse path: the signal is passed from the sixth network junction 198*f* to the fifth network junction 198*e* across the first switch chain 214, the second switch chain 216, and the third switch chain 218. The coexistence filter likewise rejects unwanted frequency components and passes the resultant signal to the coexistence filter first port 186*a* that is contiguous with the second network junction 198*b*. The signal passes across the first switch chain 220, the second switch chain 222, and the third switch chain 224 to the first network junction 198*a*, where it is output from the Bluetooth transmit input/receive output port 166.

Whether in the transmit mode, in which the signal is passed from the Bluetooth transmit input/receive output port 166 to the antenna port 174, or in the receive mode, in which the signal is passed from the antenna port 174 to the Bluetooth transmit input/receive output port 166, loss over the front end circuit 160 is understood to be minimal. Meanwhile, the unwanted noise in the transmitted signal and the received signal is filtered. With the driver power amplifier 176 and the final power amplifier 178 being turned off, current consumption from the DC bias supply thereto is close to zero. Furthermore, current consumption by the RF switches in the first switch network 188 and the second switch network 200 likewise do not consume DC current in either the enabled/connected state or the disabled/disconnected state.

Figure 6D:
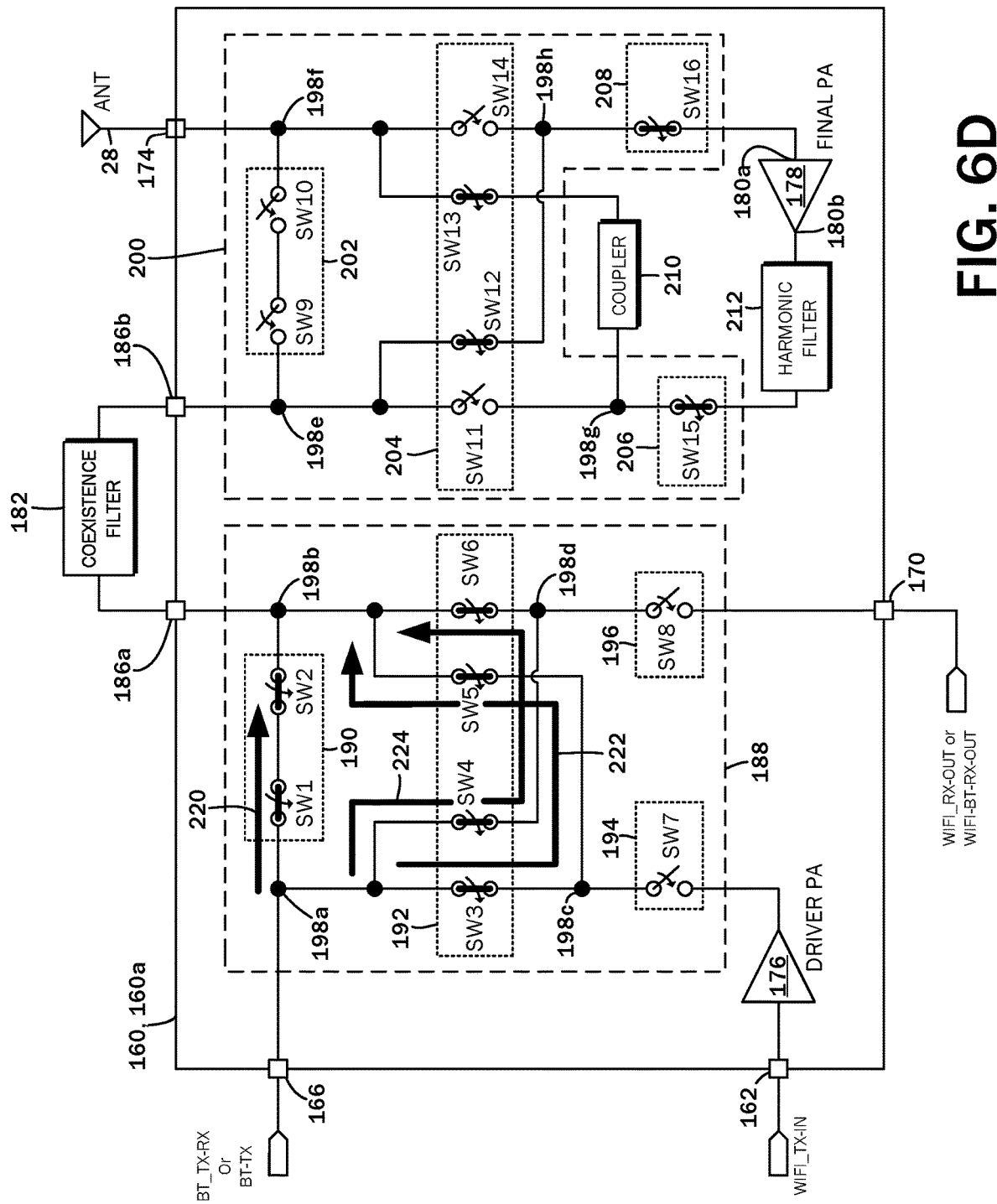
FIG. 6D is a schematic diagram of the first embodiment of the front end circuit with switch connections in a fourth/Bluetooth high power transmit operating mode.

FIG. 6D illustrates the connections made in the first switch network 188 and the second switch network 200 that enable a fourth mode in which the Bluetooth operation mode and the transmit mode are activated. The final power amplifier 178 is used to amplify the Bluetooth signal, and as the driver power amplifier 176 is dedicated specifically to WiFi transmit operation, it is disabled. Because the Bluetooth transmit signal is amplified, this mode may be referred to as Bluetooth high power mode.

In the fourth mode, the first switch network 188 enables the same connections as the third mode, discussed above. The third subsegment 194/switch SW7 disconnects the driver power amplifier 176 from the first switch network 188, and the fourth subsegment 196/switch SW8 disconnects the hybrid WiFi/Bluetooth receive output port 170 from the first switch network 188. The first subsegment 190 and the second subsegment 192 are operated together to connect the first network junction 198*a* to the second network junction 198*b*.

Specifically, three switch chains are established in the first subsegment 190 and the second subsegment 192, each of which are connected in parallel to each other. There is the first switch chain 220 over the first subsegment 190, and specifically the switches SW1 and SW2. The second and third of the three switch chains is over the second subsegment 204. The second switch chain 222 is that which is across the enabled or connected switches SW3 and SW5 and through the intermediary node of the third network junction 198*c*. A third switch chain 224 is that which is across the enabled or connected switches SW4 and SW6 over the intermediary node of the fourth network junction 198*d*. The multiple chain, parallel connection is contemplated to minimize losses between the second network junction 198*b* and the first network junction 198*a*. The unwanted frequency components are rejected by the coexistence filter 182, and the resultant transmit signal is passed to the coexistence filter second port 186*b*.

Because the final power amplifier 178 is used to amplify the Bluetooth transmit signal and ultimately output to the antenna port 174, the final power amplifier 178 is forwardly connected. The connections established by the second switch network 200 are therefore understood to be the same as the connections for the first mode in which the WiFi transmit signal is similarly amplified by the final power amplifier 178. Again, certain switch connections in the second subsegment 204 are enabled, as are the third subsegment 206/switch SW15 and the fourth subsegment 208/SW16. The first subsegment 202, that is, the switches SW9 and the SW10, is disconnected, isolating the fifth network junction 198*e*/coexistence filter second port 186*b* from the sixth network junction 198*f*/antenna port 174.

In the second subsegment 204, the switch SW12 interconnects the fifth network junction 198*e* to the eighth network junction 198*h*. The eighth network junction 198*h*, in turn, is connected to the input 180*a* of the final power amplifier 178 over the fourth subsegment 208/SW16 that is also enabled or connected. The further amplified transmit signal is output to the harmonic filter 212 and passed to the seventh network junction over the connected or enabled third subsegment 206/switch SW15. The amplified Bluetooth transmit signal is passed through the directional coupler, and to the sixth network junction 198*f* and the antenna port 174 over another connection in the second subsegment 204, switch SW13. The switch SW11 is disabled or disconnected, isolating the seventh network junction 198*g* from the fifth network junction 198*e*. Similarly, the switch SW14 is disabled or disconnected, isolating the sixth network junction 198*f* from the eighth network junction 198*h*.

The fourth mode is contemplated to maximize the gain of the Bluetooth transmit chain through the front end circuit 160*a*, along with attendant increases in the power level of the RF signal radiated from the antenna 28. The unwanted noise in the transmitted signal is filtered by the coexistence filter 182. With the final power amplifier 178 being turned on, there is understood to be an increase in current consumption from the DC bias supply relative to the third (low power Bluetooth transmit) mode.

Figure 6E:
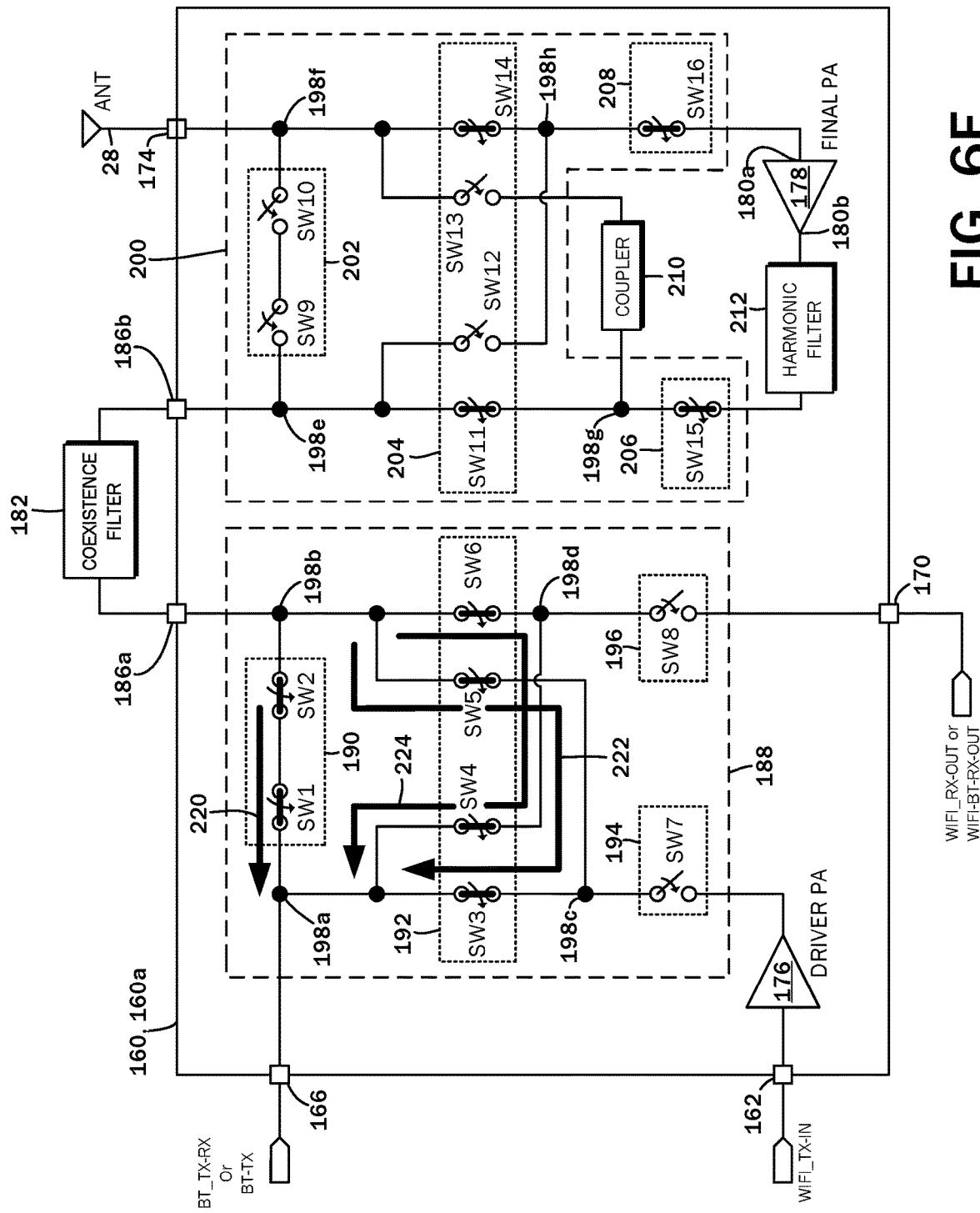
FIG. 6E is a schematic diagram of the first embodiment of the front end circuit with switch connections in a fifth/Bluetooth high sensitivity receive operating mode.

FIG. 6E illustrates the connections made in the first switch network 188 and the second switch network 200 that enable a fifth mode in which the Bluetooth operation mode and the receive function mode are activated. The final power amplifier 178 is used to amplify the received Bluetooth signal, and as the driver power amplifier 176 is dedicated specifically to WiFi transmit operation, it is disabled. Because the Bluetooth receive signal is amplified, this mode may be referred to as Bluetooth high sensitivity mode.

Because the final power amplifier 178 is used to amplify the Bluetooth receive signal as received from the antenna port 174 and ultimately output to the coexistence filter second port 186*b*, the final power amplifier 178 is reversely connected. The connections established by the second switch network 200 are different than those discussed above when the final power amplifier 178 is forwardly connected. The first subsegment 202, that is, the switches SW9 and the SW10, is disconnected, isolating the fifth network junction 198*e*/coexistence filter second port 186*b* from the sixth network junction 198*f*/antenna port 174.

In the second subsegment 204, the sixth network junction 198*f* is connected to the eighth network junction 198*h* with the switch SW14 being enabled or connected. Although the switch SW13 has a connection point to the sixth network junction 198*f*, it is disabled or disconnected, thereby isolating the seventh network junction 198*g* from the same. Likewise, the switch SW12, which on one end is connected to the fifth network junction 198*e*, is disabled or disconnected, thereby isolating the fifth network junction 198*e* from the eighth network junction 198*h*. The fourth subsegment 208/switch SW16 is enabled or connected, thereby connecting the eighth network junction 198*h* to the final power amplifier 178.

The received Bluetooth signal is thus passed from the antenna port 174 to the input 180*a* of the final power amplifier 178 through the sixth network junction 198*f*, the switch SW14, the eighth network junction 198*h*, and the fourth subsegment 208/switch SW16. The signal is amplified by the final power amplifier 178, and the unwanted harmonic frequency components of the received Bluetooth signal are removed by the harmonic filter 212. In this mode, the final power amplifier 178 is operating as a low noise amplifier (LNA). The third subsegment 206/switch SW15 is also enabled or connected, passing the amplified and filtered receive signal to the seventh network junction 198*g*. In the second subsegment 204, the switch SW11 is enabled or connected, thus connecting the seventh network junction 198*g* to the fifth network junction 198*e* that is common with the coexistence filter second port 186*b*.

Although unimportant in the fifth mode, the amplified Bluetooth receive signal is passed through the coexistence filter 182. The first switch network 188 enables the same connections as the third and fourth modes as discussed above. The first subsegment 190 and the second subsegment 192 are operated together to connect the second network junction 198*b* to the first network junction 198*a*. The three switch chains are established in the first subsegment 190 and the second subsegment 192, each of which are connected in parallel to each other. The multiple chain, parallel connection is contemplated to minimize losses between the second network junction 198*b* and the first network junction 198*a*. The first switch chain 220 is defined over the first subsegment 190 including the switches SW2 and SW1. The second switch chain 222 is defined across the enabled or connected switches SW5 and SW3 and through the intermediary node of the third network junction 198*c*. The third switch chain 224 is defined across the enabled or connected switches SW6 and SW4 over the intermediary node of the fourth network junction 198*d*. The third subsegment 194/switch SW7 disconnects the driver power amplifier 176 from the first switch network 188, and the fourth subsegment 196/switch SW8 disconnects the hybrid WiFi/Bluetooth receive output port 170 from the first switch network 188.

The received, amplified, and filtered Bluetooth signal is then output from the Bluetooth transmit input/receive output port 166. The fifth mode is contemplated to maximize the gain of the Bluetooth receive chain through the front end circuit 160*a*, along with attendant increases in reception sensitivity. The noise figure of the Bluetooth chain is minimized, which may offset losses that are introduced by the coexistence filter 182. With the final power amplifier 178 being turned on, there is understood to be an increase in current consumption from the DC bias supply relative to the third (low power Bluetooth receive) mode.

Figure 6F:
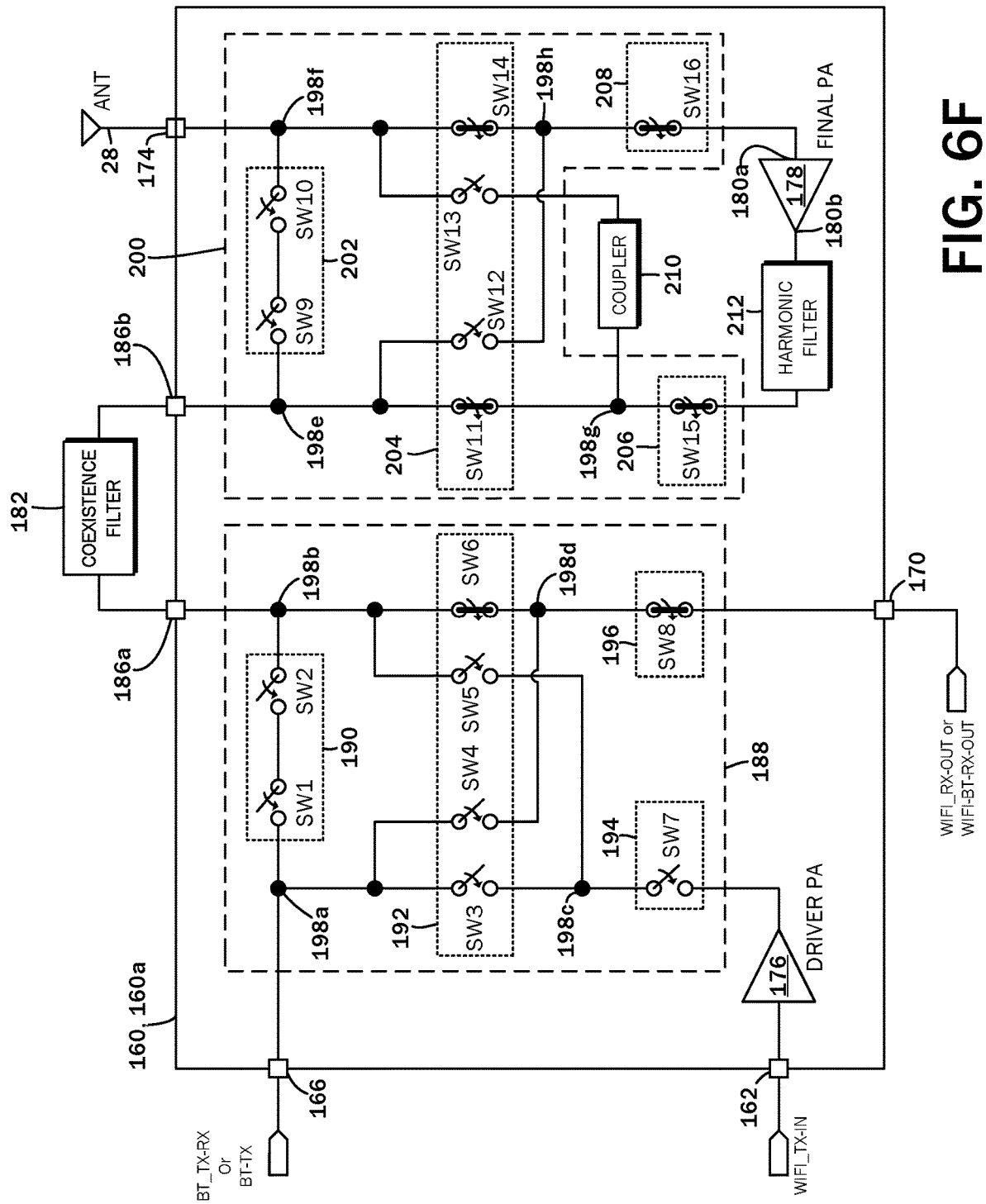
FIG. 6F is a schematic diagram of the first embodiment of the front end circuit with switch connections in a sixth/Wifi or Bluetooth high sensitivity receive operating mode.

FIG. 6F illustrates the connections made in the first switch network 188 and the second switch network 200 that enable a sixth mode in which the Bluetooth and/or WiFi operation mode and the receive function mode are activated. The final power amplifier 178 is used to amplify the received Bluetooth or WiFi signal, and as the driver power amplifier 176 is dedicated specifically to WiFi operation, it is disabled. Because the Bluetooth receive signal or the WiFi receive signal is amplified, this mode may be referred to as Bluetooth/WiFi (hybrid) high sensitivity mode. This is understood to accommodate certain Bluetooth chipsets with separate transmit and receive ports.

The connections established by the second switch network 200 are the same as those discussed above for the fifth (Bluetooth receive or high sensitivity) mode. The first subsegment 202, which includes the switches SW9 and the SW10, is disconnected, isolating the fifth network junction 198*e*/coexistence filter second port 186*b* from the sixth network junction 198*f*/antenna port 174.

The second subsegment 204 cooperates with the third subsegment 206 and the fourth subsegment 208 to reversely connect the final power amplifier 178. In the second subsegment 204, the sixth network junction 198*f* is connected to the eighth network junction 198*h* with the switch SW14 being enabled or connected. The switch SW13 is disabled or disconnected to isolate the seventh network junction 198*g* from the sixth network junction 198*f*. Likewise, the switch SW12 is disabled or disconnected to isolate the fifth network junction 198*e* from the eighth network junction 198*h*. The fourth subsegment 208/switch SW16 is enabled or connected to connect the eighth network junction 198*h* to the final power amplifier 178.

The received Bluetooth or WiFi signal is passed from the antenna port 174 to the input 180*a* of the final power amplifier 178 through the sixth network junction 198*f*, the switch SW14, the eighth network junction 198*h*, and the fourth subsegment 208/switch SW16. The signal is amplified by the final power amplifier 178, and the unwanted harmonic frequency components of the received Bluetooth or WiFi signal are removed by the harmonic filter 212. In this mode, the final power amplifier 178 is operating as a low noise amplifier (LNA). The third subsegment 206/switch SW15 is also enabled or connected, passing the amplified and filtered receive signal to the seventh network junction 198*g*. In the second subsegment 204, the switch SW11 is enabled or connected, thus connecting the seventh network junction 198*g* to the fifth network junction 198*e* that is common with the coexistence filter second port 186*b*.

Whether receiving a Bluetooth signal or a WiFi signal, the filtering for noise components in the LTE/GPS reception band is unimportant to the operation in the sixth mode. Nevertheless, such signals pass through the coexistence filter 182. The first switch network 188 establishes connections to direct the received and amplified WiFi or Bluetooth signal to the hybrid WiFi/Bluetooth receive output port 170. The first subsegment 190, that is, the switches SW1 and SW2, are disabled or disconnected, and the second network junction 198*b* is isolated from the first network junction 198*a*. Furthermore, the third subsegment 194/switch SW7 disconnects the driver power amplifier 176 since it is utilized for WiFi transmit operations. In the second subsegment 192, the switch SW6 is enabled or connected, thereby connecting the second network junction 198b with the fourth network junction 198d. The remaining switches of the second subsegment 192, however, are disabled or disconnected, thus isolating both the first network junction 198a and the third network junction 198c from the second network junction 198b. The fourth subsegment 196/Switch SW8 is enabled or connected, thereby connecting the fourth network junction 198d to the hybrid WiFi/Bluetooth receive output port 170.

The received, amplified, and filtered Bluetooth or WiFi signal is then output from the hybrid Bluetooth receive output port 170. The sixth mode is contemplated to maximize the gain of the Bluetooth or WiFi receive chain through the front end circuit 160a, along with attendant increases in reception sensitivity. The noise figure of the receive chain is minimized, which may offset losses that are introduced by the coexistence filter 182. With the final power amplifier 178 being turned on, there is understood to be an increase in current consumption from the DC bias supply relative to the third (low power Bluetooth receive) mode.

Figure 6G:
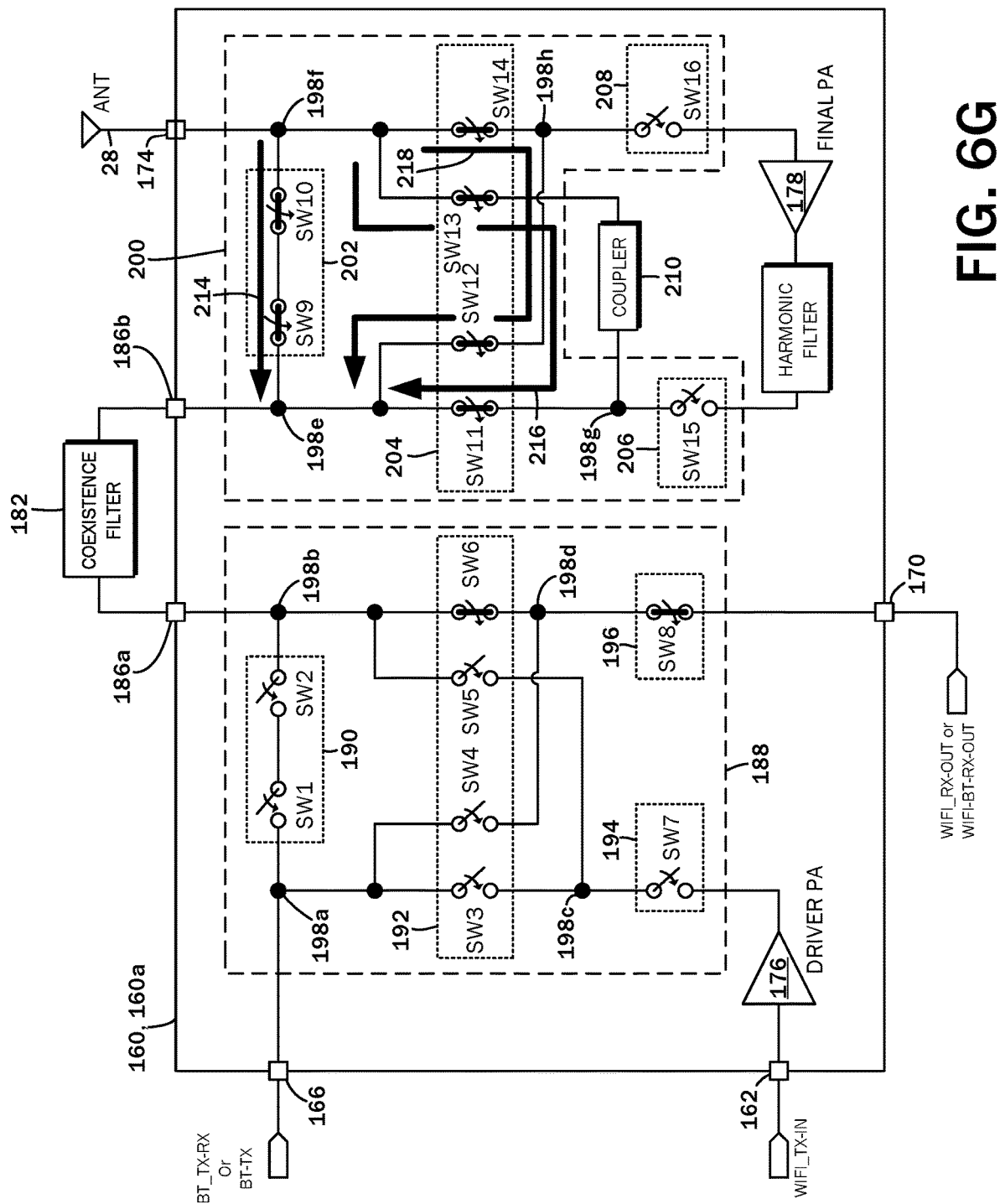
FIG. 6G is a schematic diagram of the first embodiment of the front end circuit with switch connections in a seventh/Wifi or Bluetooth low current receive operating mode.

FIG. 6G illustrates the connections made in the first switch network 188 and the second switch network 200 that enable a seventh mode in which the Bluetooth and/or WiFi operation mode and the receive function mode is activated. In this mode, however, both the driver power amplifier 176 and the final power amplifier 178 are disabled to minimize current draw, and therefore may be referred to as a low current mode.

The same connections in the second switch network 200 as with the second and third modes above are enabled in the seventh mode. The third subsegment 206/switch SW15 and the fourth subsegment 208/switch SW16 are disabled and disconnected, disconnecting the final power amplifier 178 from the second switch network 200. The switches of the first subsegment 202 and the second subsegment 204 are activated to connect the fifth network junction 198e, that is, the coexistence filter second port 186b, to the sixth network junction 198f, that is, the antenna port 174. The connections of the first switch chain 214, the second switch chain 216, and the third switch chain 218 are applied in this mode to this end.

As described above, the first switch chain 214 is comprised of the first subsegment 202 with the constituent switches SW9 and SW10, both of which are enabled to connect the sixth network junction 198f and the fifth network junction 198e. The second switch chain 216 is defined by selected switches in the second subsegment 204—the switches SW11 and SW13, and the third switch chain 218 is likewise defined by another subset of selected switches in the second subsegment 204—the switches SW12 and SW14. The three parallel paths are understood to minimize losses between the sixth network junction 198f and the fifth network junction 198e.

Whether receiving a Bluetooth signal or a WiFi signal, the filtering for noise components in the LTE/GPS reception band is unimportant to the operation in the seventh mode. The signals still pass through the coexistence filter 182.

The first switch network 188 establishes connections to direct the received WiFi or Bluetooth signal to the hybrid WiFi/Bluetooth receive output port 170. The first subsegment 190, including the switches SW1 and SW2 are disabled or disconnected, and the second network junction 198b is isolated from the first network junction 198a. Furthermore, the third subsegment 194/switch SW7 disconnects the driver power amplifier 176. In the second subsegment 192, the switch SW6 is enabled or connected, thereby connecting the second network junction 198b with the fourth network junction 198d. The remaining switches of the second subsegment 192 are disabled or disconnected to isolate both the first network junction 198a and the third network junction 198c from the second network junction 198b. The fourth subsegment 196/Switch SW8 is enabled or connected, thereby connecting the fourth network junction 198d to the hybrid WiFi/Bluetooth receive output port 170.

The received and filtered Bluetooth or WiFi signal is then output from the hybrid Bluetooth receive output port 170. The seventh mode is contemplated to minimize power consumption during WiFi or Bluetooth reception, as the driver power amplifier 176 and the final power amplifier 178 are turned off. Current draw from the DC bias supply is therefore contemplated to be close to zero. Again, current consumption by the RF switches in the first switch network 188 and the second switch network 200 likewise do not consume DC current in either the enabled/connected state or the disabled/disconnected state.

Figure 7:
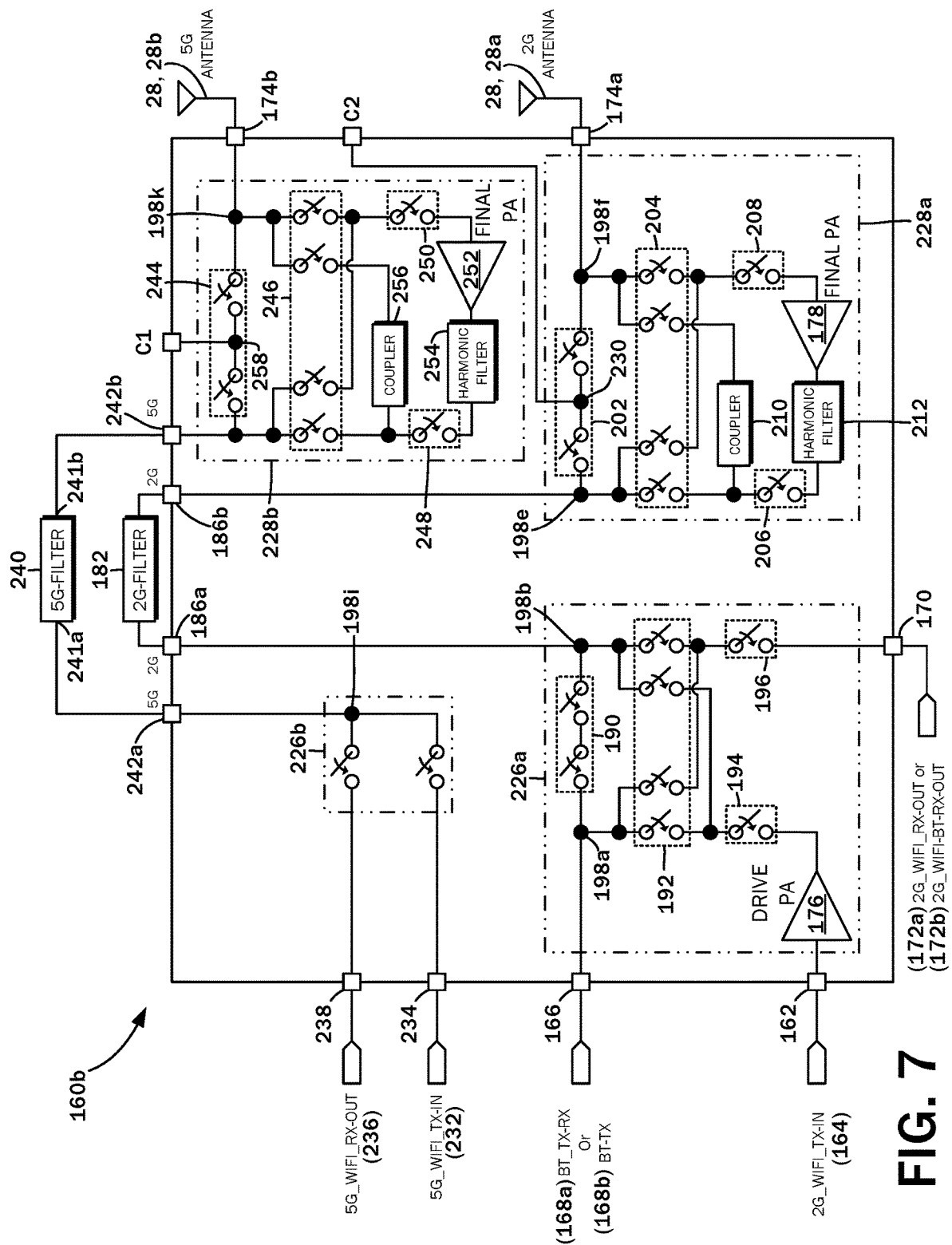
FIG. 7 is a schematic diagram of a second embodiment of the front end circuit of the present disclosure for a dual band, dual mode WiFi-Bluetooth transceiver.

With reference to the schematic diagram of FIG. 7, a second embodiment 160b of the RF front end circuit is configured to operate with a multimode, multi-frequency band transceiver. It will be recognized that earlier WiFi modalities utilized the 2.4 GHz band, though further iterations of the standard also specify the 5 GHz band. The multi-mode, multi-frequency band transceiver additionally implements the 5 GHz modality, and so the front end circuit 160b likewise includes features therefor. The second embodiment of the front end circuit 160b incorporates blocks that are common to the first embodiment of the front end circuit 160a. Referring back to the schematic diagram of FIG. 5, the front end circuit 160a may be generally segregated into a transceiver-side block 226 and an antenna-side block 228.

As shown in FIG. 7, the second embodiment of the front end circuit 160b also includes the first transceiver-side block 226a and the first antenna-side block 228a. These circuit components are specific to a first frequency band (2 GHz, or low band), and otherwise function in the same way as the corresponding blocks of the first embodiment of the front end circuit 160a described above. One WiFi mode shares the same 2 GHz operating frequency band with Bluetooth, so the first transceiver-side block 226a and the first antenna-side block 228a may be configured the same as the transceiver-side block 226 and the antenna-side block 228 of the first embodiment of the front end circuit 160a. Thus, the first transceiver-side block 226a has the same first switch network 188 with the first subsegment 190, the second subsegment 192, the third subsegment 194, and the fourth subsegment 196. Moreover, the first transceiver-side block 226a includes the driver power amplifier 176, the input of which is connected to the WiFi transmit input port 162. Because this port is connectible to a 2 GHz-specific WiFi transceiver (WiFi_TX-IN 164), it may be referred to as a first operating mode, first frequency band transmit input port.

Certain Bluetooth transceiver implementations provide bi-directional input/output ports, or separate transmit output ports and receive input ports. The second embodiment of the front end circuit 160b may accommodate both configurations, and may be connectible to a combination transmit-receive connection or separate transmit output ports and receive input ports. The first subsegment 190 and the second subsegment 192 are connected at the first network junction 198a, which in turn is tied to the Bluetooth transmit input/receive output port 166. This port may also be referred to as the second operating mode transmit input/receive output port, which accepts either a Bluetooth transmit/receive connection (BT_TX-RX 168*a*) or a Bluetooth transmit connection (BT_TX 168*b*). Where the Bluetooth transmit/receive ports are shared such as in the Bluetooth transmit/input receive output port 166, the port 170 may be utilized as a receive output port for the 2 GHz-specific WiFi transceiver connection (2G_WiFi_RX-OUT 172*a*). However, where the Bluetooth receive port is separated, the port 170 may have a shared function as an output port for the Bluetooth transceiver. This combined 2G-WiFi and Bluetooth receive connection from the transceiver (2G_WiFi-BT_RX-OUT 172*b*) may be provided to a hybrid 2G_WiFi/Bluetooth receive output port 170, also referred to as a hybrid first operating mode, first frequency band and second operating mode receive output port.

The second network junction 198*b* between the first subsegment 190 and the second subsegment 192 generally corresponds to the output of the first transceiver-side block 226*a*. Like the first embodiment of the front end circuit 160*a*, the second embodiment of the front end circuit 160*b* contemplates the use of an external coexistence filter 182. This filter is understood to be specific to the 2 GHz frequency band, so it may be referred to as a 2G filter. Although the coexistence filter 182 is illustrated as being external to the front end circuit 160*b*, alternative embodiments also contemplate the filter being an internal part of the same. As will be described in further detail below, other embodiments contemplate the use of different external devices, so the port of the front end circuit 160*b* to which the coexistence filter 182 is connected may be referred to as a first frequency band external device first port 186*a*. Along these lines, the other port to which the coexistence filter 182 is connected may be referred to as a first frequency band external device second port 186*b*.

The first antenna-side block 228*a* of the second embodiment of the front end circuit 160*b* is understood to be substantially the same as the antenna-side block 228 of the first embodiment of the front end circuit 160*a*. That is, the second switch network 200 includes the first subsegment 202, the second subsegment 204, the third subsegment 206, and the fourth subsegment 208. Furthermore, the final power amplifier 178 connected in series with the harmonic filter 212 is forwardly and reversely connectible to the second switch network 200. The fifth network junction 198*e* is connected to the second port of the coexistence filter 182 over the first frequency band external device second port 186*b*, and the sixth network junction 198*f* is connected to a first frequency band antenna port 174*a*, more generally referred to as a first frequency band antenna port. The antenna connected to the first frequency band antenna port 174*a* is likewise specific to the 2 GHz operating frequency, so it may be referred to as a 2G antenna 28*a*.

The first subsegment 202 in the first antenna-side block 228*a* of the second embodiment of the front end circuit 160*b* defines an inter-switch junction 230 that is common with an intermediate junction port C1. Additional details and the possible usages thereof will be described in the context of other embodiments.

The second transceiver-side block 226*b* specific to the 5 GHz frequency band (high band) is for the WiFi operating mode and is not shared with any other operating mode. Accordingly, a simpler switching modality may be utilized. The second embodiment of the front end circuit 160*b* accepts a 5 GHz WiFi transmit connection (5G_WiFi_TX-IN 232) at a 5G_WiFi transmit input port 234. Additionally, there is a 5G_WiFi receive output port 238 that accepts a connection from a 5 GHz WiFi receive connection (5G_Wi-Fi_RX-OUT 236). The second transceiver-side block 226*b* includes one single pole, single throw switch connected to the transmit input port 234, and another single pole, single throw switch connected to the 5G_WiFi receive output port 238. The common pole terminals of these switches are joined at a ninth network junction 198*i*. A 5 GHz driver amplifier stage may be connected between the 5G_WiFi transmit input port 234 and the second transceiver-side block 226*b* to amplify a 5G_WiFi transmit signal to some extent.

Another external coexistence filter 240 specific to the 5 GHz frequency band may be connectible to the second embodiment of the front end circuit 160*b*. Thus, there may be a second frequency band external device first port 242*a* and a second frequency band external device second port 242*b* to which the first and second filter ports 241*a*, 241*b* are connected. The second frequency band external device first port 242*a* is common with the ninth network junction 198*i*, while the second frequency band external device second port 242*b* is common with a tenth network junction 198*j*. The second antenna-side block 228*b* is understood to be configured similarly to the first antenna-side block 228*a* that is for the first frequency band, in that there is a first subsegment 244 that is substantially the same as the first subsegment 202, a second subsegment 246 that is substantially the same as the second subsegment 204, a third subsegment 248 that is substantially the same as the third subsegment 206, and a fourth subsegment 250 that is substantially the same as the fourth subsegment 208. Additionally, there is a final power amplifier 252 connected in series with a harmonic filter 254, as well as a directional coupler that is connected to the second subsegment 204. A second antenna 28*b* that is tuned for the high band 5 GHz frequencies is connected to a second frequency band antenna port 174*b*, which is common with an eleventh network junction 198*k*. The first subsegment 244 in the second antenna-side block 228*b* defines an inter-switch junction 258 that is common with an intermediate junction port C2. Additional details and the possible usages of the intermediate junction ports C1 and C2 will be described in the context of other embodiments.

The second antenna-side block 228*b* may operate to make the same switch interconnections as described above in the context of the first antenna-side block 228*a*, but in the context of the 5 GHz frequency band WiFi operating mode. Specifically, the second transceiver-side block 226*b* and the second antenna-side block 228*b* may have a high power transmit mode in which the final power amplifier 178 is forwardly connected to amplify the transmit input signal from the transceiver to be radiated from the second antenna 28*b*. Alternatively, the final power amplifier 178 may be disabled and disconnected in a low current mode, such that the 5 GHz frequency band WiFi transmit signal directly from the transceiver is radiated from the second antenna 28*b*. Two receive function modes are also contemplated: a high sensitivity mode and a low current mode. In the high sensitivity mode, the final power amplifier 178 is reversely connected to amplify the received signal from the second antenna 28*b* and passed to the transceiver via the second transceiver-side block 226*b*. It is also possible to disable and disconnect the final power amplifier 178, such that the received signal from the second antenna 28*b* is passed to the transceiver without amplification.

In all cases, the transmit signal or the receive signal is filtered by the 5 GHz frequency band coexistence filter 240. Both this filter and the 2 GHz frequency band coexistence filter 182 may be implemented as a LTCC device, a SAW device, a BAW device, a MEMS device, or any other suitable passive or active component filtering modality. The transmit and receive operations of the 5 GHz frequency/high band circuit elements, e.g., the second transceiver-side block 226b and the second antenna-side block 228b, are understood to function independently of the 2 GHz frequency/low band circuit elements, e.g., the first transceiver-side block 226a and the first antenna-side block 228a. Thus, simultaneous 5 GHz and 2 GHz operations are possible.

The foregoing components of the second embodiment of the front end circuit 160b, including the driver power amplifier 176, the final power amplifiers 178, 252, the directional couplers 210, 256, the harmonic filters 212, 254, and the various switches may be fabricated on a single semiconductor die substrate. As explained above in the context of the first embodiment of the front end circuit 160a, the switches may be fabricated with any suitable semiconductor technology, including CMOS, SOI, HEMT, PHEMT, and so on. Likewise, the driver power amplifier 176 and the final power amplifiers 178, 252 may be fabricated with semiconductor technology suitable therefor, including CMOS, SOI, SiGe, and GaAs HBT, and so on. Those having ordinary skill in the art will recognize the benefits and compromises of each while being able to select a suitable semiconductor fabrication technology for a given application. Preferably, however, the final power amplifiers 178, 252 may be implemented with CMOS because maximum modulation noise rejection at closely positioned frequencies has been achieved therewith.

Figure 8:
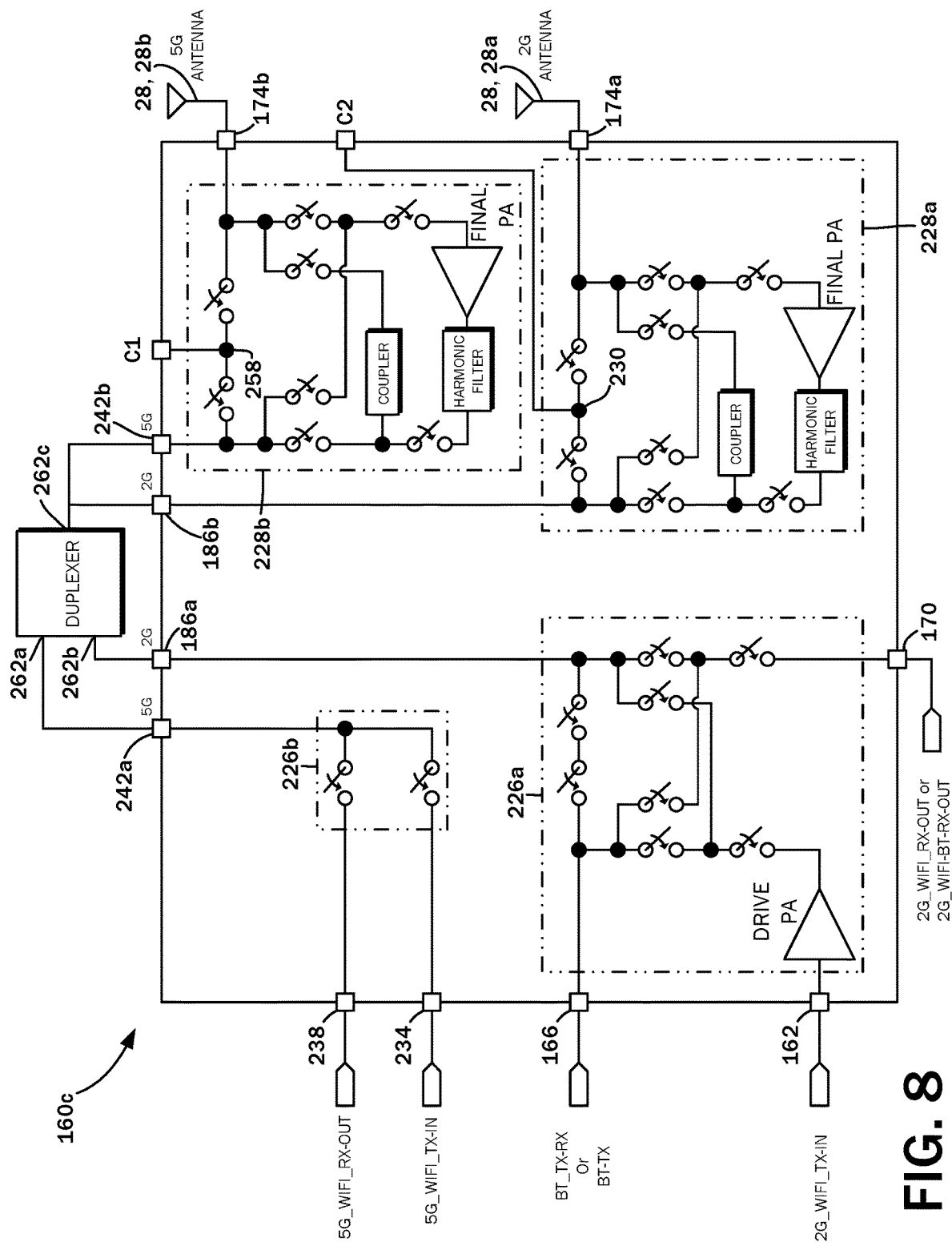
FIG. 8 is a schematic diagram of the third embodiment of the front end circuit of the present disclosure for a dual band, dual mode WiFi-Bluetooth transceiver utilizing a duplexer.

FIG. 8 illustrates a third embodiment of the front end circuit 160c in which the separate coexistence filters 182, 240 for the 2 GHz frequency/low band and the 5 GHz frequency/high band, respectively, are replaced with a duplexer 260. The front end circuit 160c otherwise shares the same configuration of the second embodiment of the front end circuit 160b, including the first transceiver-side block 226a and its constituent components, the first antenna-side block 228a and its constituent components, the second transceiver-side block 226b and its constituent components, and the second antenna-side block 228b. The front end circuit 160c includes the 2G_WiFi transmit input port 162, the Bluetooth transmit/input receive output port 166, and the hybrid 2G WiFi/Bluetooth receive output port 170, along with the 5G_WiFi transmit input port 234 and the 5G_WiFi receive output port 238. The first or 2G antenna 28a is connected to the first frequency band antenna port 174a, and the second or 5G antenna 28b is connected to the second frequency band antenna port 174b.

The front end circuit 160c also incorporates the first frequency band external device first port 186a that is connected to the first transceiver-side block 226a, and the first frequency band external device second port 186b that is connected to the first antenna-side block 228a. The second frequency band external device first port 242a is connected to the second transceiver-side block 226b, and the second frequency band external device second port 242b is connected to the second antenna-side block 228b. The foregoing is also found in the second embodiment of the front end circuit 160b, and the functionality thereof has been described above. Instead of individual coexistence filters, these external device ports are connected to the duplexer 260 that features a first port 262a, a second port 262b, and a third port 262c. The first port 262a is connected to the second frequency band external device first port 242a, the second port 252b is connected to the first frequency band external device first port 186a, and the third port 262c is connected to both the first frequency band external device second port 186b and the second frequency band external device second port 242b. The duplexer 260 may be implemented as a LTCC device, a SAW device, a BAW device, a MEMS device, or any other suitable passive or active component modality.

Figure 9:
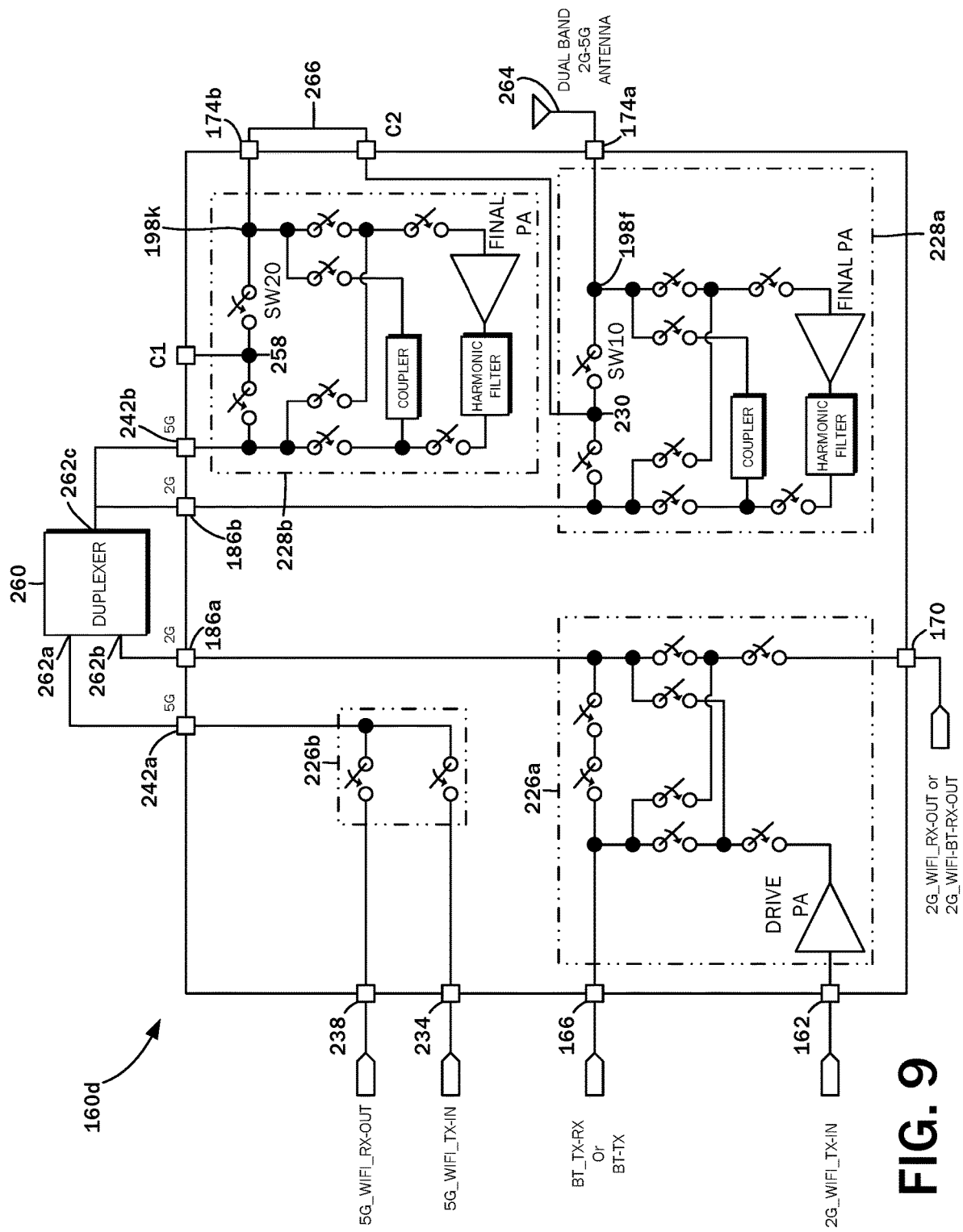
FIG. 9 is a schematic diagram of a fourth embodiment of the front end circuit of the present disclosure for a dual band, dual mode WiFi-Bluetooth transceiver with a dual band antenna connected to a first antenna port.

FIG. 9 illustrates a fourth embodiment of the front end circuit 160d, which is configured to connect one dual band antenna 264 rather than separate 5G and 2G antennas 28a, 28b as in the earlier described embodiments of the front end circuit 160a-160c. The fourth embodiment of the front end circuit 160d otherwise shares the same configuration of the third embodiment of the front end circuit 160c, including the first transceiver-side block 226a and its constituent components, the first antenna-side block 228a and its constituent components, the second transceiver-side block 226b and its constituent components, the second antenna-side block 228b, and the duplexer 260. The front end circuit 160c includes the 2G_WiFi transmit input port 162, the Bluetooth transmit/input receive output port 166, and the hybrid 2G_WiFi/Bluetooth receive output port 170, along with the 5G_WiFi transmit input port 234 and the 5G_WiFi receive output port 238. The duplexer 260 is connected to the first frequency band external device first port 186a, the second frequency band external device first port 242a, the first frequency band external device second port 186b, and the second frequency band external device second port 242b.

The front end circuit 160d also includes the first frequency band external device first port 186a that is connected to the first transceiver-side block 226a, and the first frequency band external device second port 186b that is connected to the first antenna-side block 228a. The second frequency band external device first port 242a is connected to the second transceiver-side block 226b, and the second frequency band external device second port 242b is connected to the second antenna-side block 228b.

The duplexer 260 is connected to the second frequency band external device first port 242a, the first frequency band external device first port 186a, the first frequency band external device second port 186b, and the second frequency band external device second port 242b in accordance with the configuration described above. However, as was illustrated in the second embodiment of the front end circuit 160b, rather than utilizing the duplexer 260, individual coexistence filters specific to the operating frequency band may be substituted.

As described above, the inter-switch junction 230 in the first antenna-side block 228a is connected to the intermediate junction port C2, and the inter-switch junction 258 in the second antenna-side block 228b is connected to the intermediate junction port C1. The sixth network junction 198f in the first antenna-side block 228a is connected to the first frequency band antenna port 174a, and in turn, the dual band antenna 264 is connected thereto. A jumper 266 interconnects the second frequency band antenna port 174b to the intermediate junction port C2, which in turn is connected to the inter-switch junction 230. The second frequency band antenna port 174b is common with the eleventh network junction 198k in the second antenna-side block 228b and is otherwise the junction to which a high band antenna would have been connected. The 5G blocks (the second transceiver-side block 226b and the second antenna-side block 228b) can be operated independently of the 2G blocks (the first transceiver-side block 226a and the first antenna-side block 228a), in either the transmit mode or the receive mode.

Figure 10:
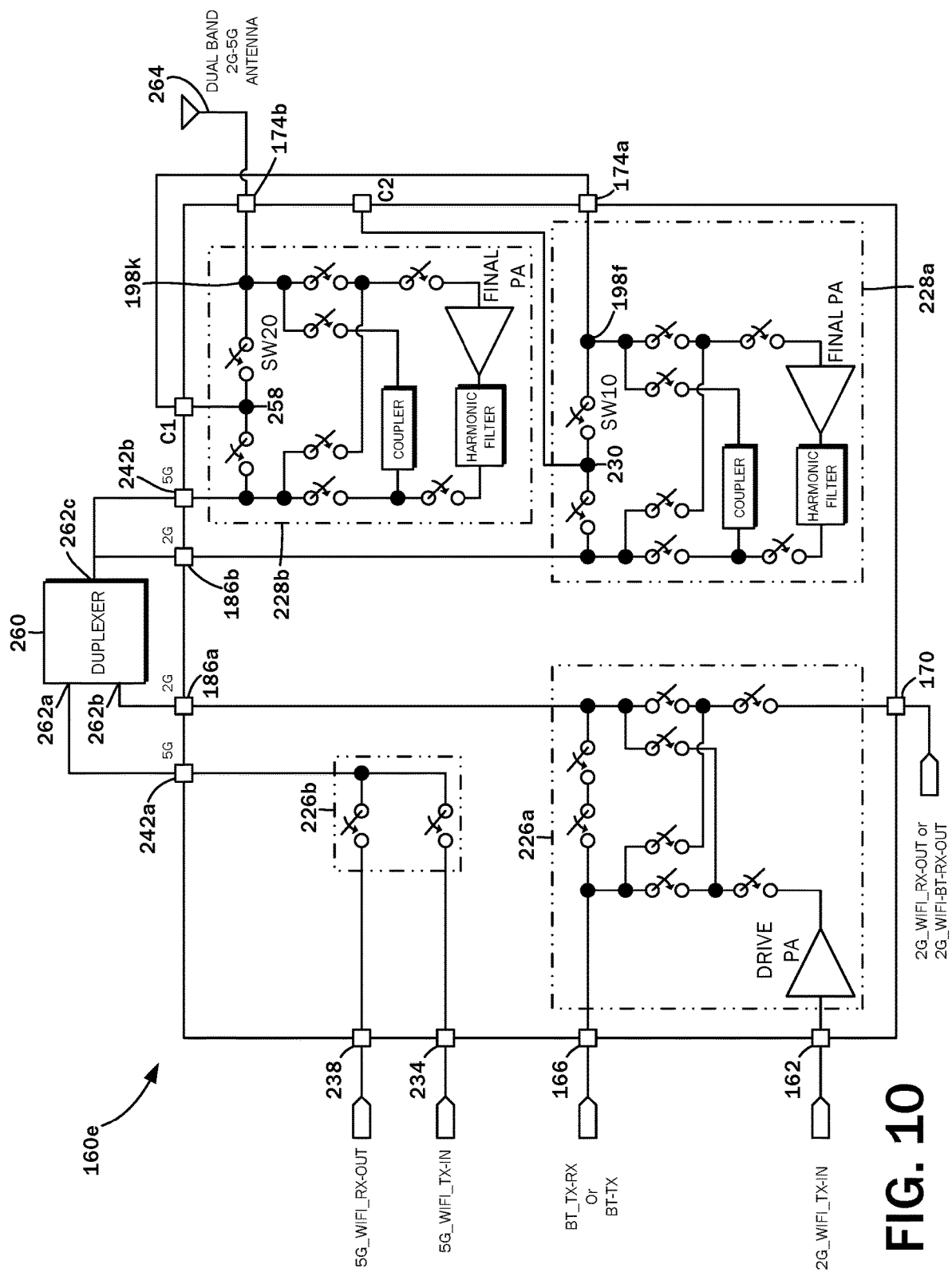
FIG. 10 is a schematic diagram of a fifth embodiment of the front end circuit of the present disclosure with a dual band antenna connected to a second port.

FIG. 10 illustrates a fifth embodiment of the front end circuit 160e that is configured to connect one dual band antenna 264. Instead of utilizing the first frequency band antenna port 174*a*, the dual band antenna 264 is connected to the second frequency band antenna port 174*b*. The fifth embodiment of the front end circuit 160*e* otherwise shares the same configuration of the third embodiment of the front end circuit 160*c* and the fourth embodiment of the front end circuit 160*d*, including the first transceiver-side block 226*a* and its constituent components, the first antenna-side block 228*a* and its constituent components, the second transceiver-side block 226*b* and its constituent components, the second antenna-side block 228*b*, and the duplexer 260. The front end circuit 160*d* includes the 2G_WiFi transmit input port 162, the Bluetooth transmit/input receive output port 166, and the hybrid 2G_WiFi/Bluetooth receive output port 170, along with the 5G_WiFi transmit input port 234 and the 5G_WiFi receive output port 238. The duplexer 260 is connected to the first frequency band external device first port 186*a*, the second frequency band external device first port 242*a*, the first frequency band external device second port 186*b*, and the second frequency band external device second port 242*b*.

The front end circuit 160*d* also includes the first frequency band external device first port 186*a* that is connected to the first transceiver-side block 226*a*, and the first frequency band external device second port 186*b* that is connected to the first antenna-side block 228*a*. The second frequency band external device first port 242*a* is connected to the second transceiver-side block 226*b*, and the second frequency band external device second port 242*b* is connected to the second antenna-side block 228*b*.

The duplexer 260 is connected to the second frequency band external device first port 242*a*, the first frequency band external device first port 186*a*, the first frequency band external device second port 186*b*, and the second frequency band external device second port 242*b* in accordance with the configuration described above.

As described above, the inter-switch junction 230 in the first antenna-side block 228*a* is connected to the intermediate junction port C2, and the inter-switch junction 258 in the second antenna-side block 228*b* is connected to the intermediate junction port C1. The dual band antenna 264 is connected to the second frequency band antenna port 174*b*, while a jumper 268 interconnects the first frequency band antenna port 174*a* to the intermediate junction port C1 that is in turn connected to the inter-switch junction 258. The first frequency band antenna port 174*a* is common with the sixth network junction 198*f* in the first antenna-side block 228*a* and is otherwise the junction to which the low band antenna would have been connected. The 5G blocks (the second transceiver-side block 226*b* and the second antenna-side block 228*b*) can be operated independently of the 2G blocks (the first transceiver-side block 226*a* and the first antenna-side block 228*a*), in either the transmit mode or the receive mode. Between the fifth embodiment of the front end circuit 160*e* and the fourth embodiment of the front end circuit 160*d* described above, the additional losses of the switch SW 10 in the 2G block and the SW20 in the 5G block may be budgeted differently.

The particulars shown herein are by way of example and for purposes of illustrative discussion of the embodiments of the present disclosure only and are presented in the cause of providing what is believed to be the most useful and readily understood description of the principles and conceptual aspects. In this regard, no attempt is made to show details with more particularity than is necessary, the description taken with the drawings making apparent to those skilled in the art how the several forms of the present disclosure may be embodied in practice.

What is claimed is:

1. A radio frequency front end circuit for a multimode transceiver comprising:
   a first operating mode transmit input port;
   a second operating mode transmit input/receive output port;
   a hybrid first and second operating mode receive output port;
   a coexistence filter first port;
   a coexistence filter second port;
   an antenna port;
   a first switch network with one or more switch elements together selectively connecting the first operating mode transmit input port, the second operating mode transmit input/receive output port, and the hybrid first and second operating mode receive output port to the coexistence filter first port; and
   a second switch network with one or more switch elements together selectively connecting the coexistence filter second port to the antenna port.

2. The radio frequency front end circuit of claim 1, further comprising:
   a driver power amplifier with an input connected to the first operating mode transmit input port and an output connected to the first switch network.

3. The radio frequency front end circuit of claim 2, wherein the driver power amplifier amplifies a first operating mode transmit signal from the multimode transceiver in an initial amplification stage.

4. The radio frequency front end circuit of claim 1, further comprising:
   a coexistence filter with a first filter port connected to the coexistence filter first port and a second filter port connected to the coexistence filter second port.

5. The radio frequency front end circuit of claim 1, further comprising:
   a final power amplifier with an input and an output, the second switch network selectively connecting either the input of the final power amplifier to the antenna port and the output of the final power amplifier to the coexistence filter second port in one switch setting, or the input of the final power amplifier to the coexistence filter second port and the output of the final power amplifier to the antenna port in another switch setting.

6. The radio frequency front end circuit of claim 5, further comprising:
   a harmonic filter connected to the output of the final power amplifier.

7. The radio frequency front end circuit of claim 5, further comprising:
   a directional coupler selectively connectible in parallel with the final power amplifier.

8. The radio frequency front end circuit of claim 5, wherein the final power amplifier amplifies a first operating mode transmit signal from the multimode transceiver in a secondary amplification stage, the second switch network interconnecting the input of the final power amplifier to the coexistence filter second port and the output of the final power amplifier to the antenna port.

9. The radio frequency front end circuit of claim 8, further comprising:
   a driver power amplifier with an input connected to the first operating mode transmit input port and an output connected to the first switch network, the driver power amplifier amplifying the first operating mode transmit signal from the multimode transceiver in an initial amplification stage, and the first switch network interconnecting the output of the driver power amplifier to the coexistence filter first port.

10. The radio frequency front end circuit of claim 5, wherein the final power amplifier amplifies a second operating mode transmit signal received on the second operating mode transmit input/receive output port, the second switch network interconnecting the input of the final power amplifier to the coexistence filter second port and the output of the final power amplifier to the antenna port.

11. The radio frequency front end circuit of claim 5, wherein the final power amplifier amplifies an incoming signal received from the antenna, the second switch network interconnecting the antenna port to the input of the final power amplifier and the coexistence filter second port to the output of the final power amplifier.

\* \* \* \* \*